US008461508B2

(12) United States Patent
Seymour et al.

(10) Patent No.: US 8,461,508 B2
(45) Date of Patent: Jun. 11, 2013

(54) DEVICE, SYSTEM, AND METHOD FOR SECTIONING AND COUPLING MULTIPLE PHOTOVOLTAIC STRINGS

(75) Inventors: Eric Seymour, Fort Collins, CO (US); Jack Arthur Gilmore, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 340 days.

(21) Appl. No.: 13/016,970

(22) Filed: Jan. 29, 2011

(65) Prior Publication Data
US 2012/0025621 A1 Feb. 2, 2012

Related U.S. Application Data

(63) Continuation-in-part of application No. 12/581,793, filed on Oct. 19, 2009.

(60) Provisional application No. 61/299,958, filed on Jan. 30, 2010.

(51) Int. Cl.
*G05F 5/00* (2006.01)
(52) U.S. Cl.
USPC ................................ 250/214 R; 136/244
(58) Field of Classification Search
USPC .......... 250/214 R, 214.1; 323/222, 282–285; 136/244, 293
See application file for complete search history.

(56) References Cited

U.S. PATENT DOCUMENTS

| 3,986,097 | A | 10/1976 | Woods |
| 4,025,862 | A | 5/1977 | Gautheron |
| 4,054,827 | A | 10/1977 | Reimers |
| 4,080,646 | A | 3/1978 | Dietrich |
| 4,128,793 | A | 12/1978 | Stich |
| 4,161,023 | A | 7/1979 | Goffeau |
| 4,531,085 | A | 7/1985 | Mesenhimer |
| 4,678,983 | A | 7/1987 | Rouzies |
| 4,748,311 | A | 5/1988 | Thomas |

(Continued)

FOREIGN PATENT DOCUMENTS

| JP | 08-98549 A1 | 2/1978 |
| JP | 07-049721 A | 2/1995 |

(Continued)

OTHER PUBLICATIONS

Chinese Patent Office, "Second Office Action re Chinese Application No. 200880101640.4", Mar. 21, 2012, p. 29, Published in: CN.

(Continued)

*Primary Examiner* — Seung C Sohn
(74) *Attorney, Agent, or Firm* — Neugeboren O'Dowd PC

(57) ABSTRACT

A photovoltaic system has a power converter connected by power rails to a plurality of photovoltaic strings, each string has serially connected photovoltaic panels and switches. The switches divide each string into sections, and the strings are distributed in electrical parallel paths over a plurality of arrays with one section per string in each array. A first set of strings to be brought online with the power converter is initialized. A drive signal is sent to switches in the initial set of strings to couple the sections in each string of the initial set so that the set of strings come online with the power converter providing voltage and current to the power converter.

19 Claims, 14 Drawing Sheets

U.S. PATENT DOCUMENTS

| | | | |
|---|---|---|---|
| 5,270,636 | A | 12/1993 | Lafferty |
| 5,451,962 | A | 9/1995 | Steigerwald |
| 5,781,419 | A | 7/1998 | Kutkut et al. |
| 5,923,100 | A | 7/1999 | Lukens et al. |
| 5,932,994 | A | 8/1999 | Jo et al. |
| 6,093,885 | A | 7/2000 | Takehara et al. |
| 6,115,273 | A | 9/2000 | Geissler |
| 6,266,260 | B1 | 7/2001 | Zahrte, Sr. et al. |
| 6,404,655 | B1 | 6/2002 | Welches |
| 6,414,866 | B2 | 7/2002 | Huggett et al. |
| 6,625,046 | B2 | 9/2003 | Geissler |
| 6,750,391 | B2 | 6/2004 | Bower et al. |
| 6,812,396 | B2 | 11/2004 | Makita et al. |
| 6,844,739 | B2 | 1/2005 | Kasai et al. |
| 6,914,418 | B2 | 7/2005 | Sung |
| 7,053,506 | B2 | 5/2006 | Alonso et al. |
| 7,158,395 | B2 | 1/2007 | Deng et al. |
| 7,193,872 | B2 | 3/2007 | Siri et al. |
| 7,292,419 | B1 | 11/2007 | Nemir |
| 7,371,963 | B2 | 5/2008 | Suenaga et al. |
| 7,456,524 | B2 | 11/2008 | Nielsen et al. |
| 7,619,200 | B1 | 11/2009 | Seymour et al. |
| 7,701,081 | B2 | 4/2010 | Seymour |
| 7,768,751 | B2 | 8/2010 | Gilmore et al. |
| 2001/0004322 | A1 | 6/2001 | Kurokami et al. |
| 2001/0023703 | A1 | 9/2001 | Kondo et al. |
| 2001/0048605 | A1 | 12/2001 | Kurokami et al. |
| 2002/0105765 | A1 | 8/2002 | Kondo et al. |
| 2002/0195136 | A1 * | 12/2002 | Takabayashi et al. ........ 136/244 |
| 2003/0111103 | A1 | 6/2003 | Bower et al. |
| 2003/0155887 | A1 | 8/2003 | Bourilkov et al. |
| 2003/0172968 | A1 | 9/2003 | Armer et al. |
| 2004/0041665 | A1 | 3/2004 | Hode et al. |
| 2004/0211459 | A1 | 10/2004 | Suenaga et al. |
| 2005/0139259 | A1 | 6/2005 | Steigerwald et al. |
| 2005/0180181 | A1 | 8/2005 | Gaudreau et al. |
| 2006/0162772 | A1 | 7/2006 | Presher, Jr. et al. |
| 2006/0171182 | A1 | 8/2006 | Siri et al. |
| 2006/0221653 | A1 | 10/2006 | Lai et al. |
| 2006/0227472 | A1 | 10/2006 | Taylor et al. |
| 2008/0291706 | A1 | 11/2008 | Seymour et al. |
| 2009/0032082 | A1 | 2/2009 | Gilmore et al. |
| 2009/0078304 | A1 | 3/2009 | Gilmore et al. |
| 2009/0167086 | A1 | 7/2009 | Seymour |
| 2009/0167097 | A1 | 7/2009 | Seymour et al. |
| 2009/0190275 | A1 | 7/2009 | Gilmore et al. |
| 2009/0217964 | A1 | 9/2009 | Gilmore et al. |
| 2009/0283130 | A1 | 11/2009 | Gilmore et al. |
| 2010/0132758 | A1 | 6/2010 | Gilmore |
| 2010/0308662 | A1 | 12/2010 | Schatz et al. |
| 2011/0157753 | A1 | 6/2011 | Gilmore et al. |
| 2011/0168229 | A1 | 7/2011 | Gilmore et al. |
| 2012/0056638 | A1 * | 3/2012 | Swahn .................... 324/761.01 |
| 2012/0084027 | A1 * | 4/2012 | Caine ............................. 702/58 |
| 2012/0152300 | A1 * | 6/2012 | Zuckerman et al. .......... 136/244 |

FOREIGN PATENT DOCUMENTS

| | | | |
|---|---|---|---|
| JP | 09-054623 | A2 | 2/1997 |
| JP | 10-014111 | | 1/1998 |
| JP | 10-229679 | | 8/1998 |
| JP | 11-285260 | A | 10/1999 |
| JP | 2000-295786 | A | 10/2000 |
| JP | 2000-358370 | A | 12/2000 |
| JP | 2002-319687 | A | 10/2002 |
| JP | 2003-124492 | A | 4/2003 |
| JP | 2004-015941 | A | 1/2004 |
| JP | 2004-343909 | A | 12/2004 |
| JP | 2005-204485 | A | 7/2005 |
| JP | 2006-187150 | A | 7/2006 |
| JP | 2007133765 | A | 5/2007 |
| JP | 2007-201257 | A | 8/2007 |
| KR | 10-2006-0100840 | | 9/2006 |
| KR | 20-2006-0021132 | | 10/2006 |
| WO | 2007022955 | A1 | 8/2006 |
| WO | 2010065388 | A1 | 6/2010 |
| WO | 2011011022 | A1 | 1/2011 |
| WO | 2011094654 | A1 | 8/2011 |

OTHER PUBLICATIONS

Chinese Patent Office, "Office Action re Chinese Patent Application No. 200880016950.6", Apr. 17, 2012, p. 20 Published in: CN.

Japanese Patent Office, "Office Action re Japanese Application No. 2010-519272", May 25, 2012, p. 7, Published in: JP.

Korean Patent Office, "Office Action re Korean Patent Application No. 10-2011-7004034", 06192012, p. 5, Published in: KR.

Korean Patent Office, "Office Action re Korean Patent Application No. 10-2010-7002310", Aug. 13, 2012, p. 6, Published in: KR.

Rutland Wallis, Michael, "Office Action re U.S. Appl. No. 12/326,209", Mar. 23, 2012, p. 22, Published in: US.

Lee III, Henry E., "Office Action re U.S. Appl. No. 12/122,950", Jun. 7, 2012, p. 20.

Rutland Wallis, Michael, "Office Action re U.S. Appl. No. 12/326,209", Nov. 17, 2011, p. 31, Published in: US.

Lindner, Nora, "International Preliminary Report on Patentability re Application No. PCT/US12/023081", Aug. 9, 2012, Published in: CH.

O'Dowd, Sean R., "Response After Final Under 37 CFR 1.116 re U.S. Appl. No. 12/326,209", May 23, 2012, p. 6, Published in: US.

Henry E. Lee, III, "Office Action re U.S. Appl. No. 13/122,950", Jul. 14, 2011, p. 43, Published in: US.

Borroto, Alfonso Perez, "Office Action re U.S. Appl. No. 12/507,019", Nov. 14, 2011, p. 51, Published in: US.

Korean Intellectual Property Office, "Office Action re Korean Application No. 10-2009-7025699", Jun. 1, 2011, p. 12, Published in: KR.

Sean R. O'Dowd, "Response to Jun. 3, 2011 Office Action re U.S. Appl. No. 12/830,380", Sep. 16, 2011, Published in: US.

Gilmore, Jack Arthur, "U.S. Appl. No. 12/326,209, 'Device, System, and Method for Managing an Application of Power from Photovoltaic . . .'", Dec. 2, 2008, Published in: US.

Mosser, K.M., "Office Action re U.S. Appl. No. 10/398,625", Jun. 3, 2010, p. 12, Published in: US.

Gardner, Shannon M., "Office Action re U.S. Appl. No. 12/184,535", Jun. 17, 2011, p. 9, Published in: US.

Bernier, Lindsey A., "Office Action re U.S. Appl. No. 12/326,209", Jun. 28, 2011, p. 7, Published in: US.

Guinea, William, "PCT International Search Report re Application No. PCT/US09/065629", Feb. 12, 2010, Published in: PCT.

Athina Nickitas-Etienne, "International Preliminary Report on Patentability re Application No. PCT/US09/65629", Jun. 16, 2011, Published in: CH.

Sean R. O'Dowd, "Response to Jun. 28, 2011 Office Action re U.S. Appl. No. 12/326,209", Jul. 28, 2011, Published in: US.

Kolev, Vesselin, "International Search Report and Written Opinion re Application PCT/US11/023081", Apr. 27, 2011, p. 12 Published in: AU.

IEEE, "Std. 519-1992", "IEEE Recommended Practices", Apr. 12, 1993, pp. 1-100, Publisher: IEEE.

Yao, Gang, et al., "Interleaved Three-Level Boost Converter with Zero Diode Reverse-Recovery Loss", "Applied Power Electronics Conference and Exposition", Sep. 1, 2004, pp. 1090-1095, vol. 2, Publisher: IEEE, Published in: US.

Gow, J.A., et al., "Photovoltaic Converter System Suitable for Use in Small Scale Stand-Alone or Grid Connected Applications", "Proceedings Electric Power Applications", Nov. 1, 2000, pp. 535-543, vol. 147, No. 6, Publisher: IEEE, Published in: US.

Kwon, Jung-Min, et al., "Photovoltaic Power Conditioning System with Line Connection", "Transaction on Industrial Electronics", Aug. 1, 2006, pp. 1048-1054, vol. 53, No. 4, Publisher: IEEE, Published in: US.

Enslin, Johan, et al., "Integrated Photovoltaic Maximum Power Point Tracking Converter", "Transactions on Industrial Electronics", Dec. 1, 1997, pp. 769-773, vol. 44, No. 6, Publisher: IEEE, Published in: US.

Walker, Geoffrey R., et al., "Cascaded DC-DC Converter Connection of Photovoltaic Modules", "Transactions on Power Electronics", Jul. 1, 2004, pp. 1130-1139, vol. 19, No. 4, Publisher: IEEE, Published in: US.

Kim, Jung-Han, et al., "A Study on the Harmonic Elimination used Passive Filter and Active Filter", "KIIEE", 2001, pp. 77-83, Publisher: KIIEE, Published in: KR.

Ahmed, K.H., et al., "Passive Filter Design for Three-Phase Inverter Interfacing in Distributed Generation", "Electrical Power Quality and Utilization Journal", 2007, Page(s) abstract, Fig. 1 19, vol. 13, No. 2, Published in: US.

Choi, Nam Ho, "PCT International Search Report re Application No. PCT/US08/064263", Oct. 31, 2008, Published in: PCT.

Park, Jae Hun, "PCT International Search Report re Application No. PCT/US08/072108", Feb. 24, 2009, Published in: PCT.

Koh, Jae Hyun, "PCT International Search Report re Application No. PCT/US08/077734", Apr. 29, 2009, Published in: PCT.

Bae, Jin Yong, "PCT International Search Report re Application No. PCT/US08/086931", Jun. 25, 2009, Published in: PCT.

Bae, Jin Yong, "PCT International Search Report re Application No. PCT/US08/087078", Jul. 9, 2009, Published in: PCT.

Han, Sang Il, "PCT International Search Report re Application No. PCT/US09/031549", Aug. 17, 2009, Published in: PCT.

Nickitas-Etienne, Athina, "International Preliminary Report on Patentability and Written Opinion re Application No. PCT/US09/031549", Aug. 12, 2010, Published in: PCT.

Ha, Jeong Kyun, "PCT International Search Report re Application No. PCT/US09/051855", Mar. 22, 2010, Published in: PCT.

Ha, Jeong Kyun, "PCT International Search Report re Application No. PCT/US09/054904", Aug. 23, 2010, Published in: PCT.

Wang, T.C., et al., "Output Filter Design for a Grid-Interconnected Three-Phase Inverter", "IEEE", 2003, pp. 779-784, Publisher: IEEE, Published in: US.

Woo Hyuk Lee, "A Study on the Optimaztion of Input Filter for Switching Inverter", "Master Thesis", 1989, Publisher: Hanyang University.

Zhang, Michael T., et al., "Single-Phase Three-Level Boost Power Factor Correction Converter", "Applied Power Electronic Conference and Exposition", Mar. 1, 1995, pp. 434-439, vol. 1, Publisher: IEEE, Published in: US.

Pinheiro, J.R., et al., "Dual Output Three-Level Boost Power Factor Correction Converter with Unbalanced Loads", "Power Electronics Specialists Conference", Jun. 1, 1996, pp. 733-739, vol. 1, Publisher: IEEE, Published in: US.

Sohn, Seung C., "Notice of Non-Compliant Amendment Office Action re U.S. Appl. No. 12/189,187", Aug. 12, 2009, p. 2, Published in: US.

Nguyen, Danny, "Office Action re U.S. Appl. No. 12/022,147", Jan. 22, 2010, p. 46, Published in: US.

Sohn, Seung C., "Office Action re U.S. Appl. No. 12/189,187", Apr. 3, 2009, p. 14, Published in: US.

Sohn, Seung C., "Office Action re U.S. Appl. No. 11/967,933", Oct. 4, 2010, p. 29, Published in: US.

Gardner, Shannon M., "Office Action re U.S. Appl. No. 12/184,535", Nov. 10, 2010, p. 7, Published in: US.

Moyse, Ellen, "International Preliminary Report on Patentability and Written Opinion re Application No. PCT/US08/072108", Feb. 18, 2010, Published in: PCT.

Honda, Masashi, "International Preliminary Report on Patentability and Written Opinion re Application PCT/US09/051855", Feb. 24, 2011, Published in: PCT.

O'Dowd, Sean R., "Response to Oct. 4, 2010 Office Action re U.S. Appl. No. 11/967,933", Jan. 1, 2011, p. 6, Published in: US.

O'Dowd, Sean R., "Response to Jan. 22, 2010 Office Action re U.S. Appl. No. 12/022,147", Feb. 25, 2010, p. 28, Published in: US.

O'Dowd, Sean R., "Response to Nov. 10, 2011 Office Action re U.S. Appl. No. 12/184,535", Mar. 10, 2011, p. 14, Published in: US.

O'Dowd, Sean R., "Response to Apr. 3, 2009 Office Action re U.S. Appl. No. 12/189,187", Jun. 29, 2009, p. 51, Published in: US.

O'Dowd, Sean R., "Response to Notice of Non-Compliant Amendment re U.S. Appl. No. 12/189,187", Aug. 13, 2009, p. 10, Published in: US.

Sun Power, "Sun Power Discovers the Surface Polarization Effect in High Efficiency Solar Cells", Aug. 1, 2005, Published in: US.

\* cited by examiner

DEVICE, SYSTEM, AND METHOD FOR SECTIONING AND COUPLING MULTIPLE PHOTOVOLTAIC STRINGS

PRIORITY

This application claims priority to U.S. provisional application No. 61/299,958 filed Jan. 30, 2010. This application is also a continuation-in-part of U.S. patent application Ser. No. 12/581,793 filed Oct. 19, 2009, which is a continuation of U.S. patent application Ser. No. 12/189,187 entitled Device System and Method for Coupling Multiple Photovoltaic Arrays, filed Sep. 10, 2008.

FIELD OF THE INVENTION

This invention relates generally to apparatus and methods for converting solar energy to electrical energy, and more specifically to apparatus and methods for more efficient and/or effective conversion of solar energy to electrical energy.

BACKGROUND OF THE INVENTION

The transformation of light energy into electrical energy using photovoltaic (PV) systems has been known for a long time and these photovoltaic systems are increasingly being implemented in residential, commercial, and industrial applications. Although developments and improvements have been made to these photovoltaic systems over the last few years to improve their effectiveness and efficiency, continued improvement in effectiveness and efficiency of photovoltaic systems is being sought in order to make photovoltaic systems more economically viable.

Photovoltaic systems typically include, among other components, a photovoltaic array and a power converter. The photovoltaic array generates DC power and the power converter may be an inverter adapted to convert the DC power to AC power (e.g., single or three phase power). The power converter may perform an alternative function as well. For example, one power converter may convert an input DC voltage to a higher or lower output DC voltage. No matter the type of power converter used, it is often desirable to design and operate photovoltaic arrays so that the voltage that is input to the power converter is relatively high, and hence, current is low, in order to reduce costs associated with high-current elements, as well as to reduce energy losses associated with high currents.

Single photovoltaic arrays may operate in an open load state at 600 VDC. Two photovoltaic arrays operating as a bi-polar photovoltaic array system may operate in an open load state at 1200 VDC. Although photovoltaic array systems are capable of applying high open loaded voltages, array systems rarely run at or near this voltage because the loaded voltage of the array drops substantially once power is drawn from the arrays. For example, under a loaded condition, one typical bi-polar photovoltaic array system may operate at between 600 to 1000 VDC.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

According to one aspect of the invention, a photovoltaic system has a plurality of photovoltaic strings distributed over a plurality of arrays to provide a source of electrical power. Each photovoltaic string has a plurality of photovoltaic panels in electrical series and each string extends across the plurality of arrays. Each array has a portion of a string connected to another portion of the same string on another array by a tie connector. A switch in each tie connector electrically couples and decouples the portions of the string. The portions of photovoltaic strings are tie connected in parallel from array to array by the switches for each string, and all strings are connected to power rails collecting the power from all the strings. A power converter is electrically connected to the power rails and converts the power from each string. As all portions of each string are electrically coupled by its switches, the power from each string comes online to the power rails and thereby to the power converter. A controller controls the switches during system startup to electrically couple strings to the power rails in time sequence so that the power increases at the power converter without the power exceeding the power rating of the power converter as the strings come online.

In another feature of the invention, there is a method for starting up a photovoltaic system having a power converter connected by power rails to a plurality of photovoltaic strings, each string having serially connected photovoltaic panels and switches. The switches divide each string into portions, and the strings are distributed in electrical parallel paths over a plurality of arrays with one portion per string in each array. The method begins by initializing a first set of strings to be brought online with the power converter. Then a drive signal is sent to switches in the set of strings to couple the portions in each string of the set so that the set of strings come online with the power converter providing voltage and current to the power converter.

Many aspects the invention include a method for operating a photovoltaic system, the method including operating each of a plurality of photovoltaic strings in parallel between conducting rails that are coupled to a power conversion component so that current paths are formed between the conducting rails, each of the photovoltaic strings including series-arranged photovoltaic panels, and within photovoltaic string, each of the series-arranged photovoltaic panels operates at a different voltage than other ones of the photovoltaic panels; separating each of the plurality of photovoltaic strings into a plurality of string sections so that, during an idle state, current does not flow between the rails through the photovoltaic strings; and creating, during the idle state, a voltage overlap between the separated string sections in each of the photovoltaic strings so that, within each photovoltaic string, some voltages along one of the string sections are the same as some voltages along another one of the string sections.

In accordance with yet other embodiments, the invention may be characterized as a photovoltaic string coupling device that includes a first terminal to couple to a first string section of a photovoltaic string; a second terminal to couple to a second string section of a photovoltaic string; a switch disposed between the first and second terminals so as to enable the first and second string sections of the photovoltaic string to be conductively coupled when the switch is closed; and means for creating a voltage overlap between the first and second string sections when the switch is opened so that some voltages along the first string section are the same as some voltages along the second string section.

Numerous other embodiments, implementations, and details of the invention are easily recognized by those of skill in the art from the following descriptions and claims. As previously stated, the above-described embodiments and implementations are for illustration purposes only.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Exemplary embodiments of the present invention are more fully described in this Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Figure 1:
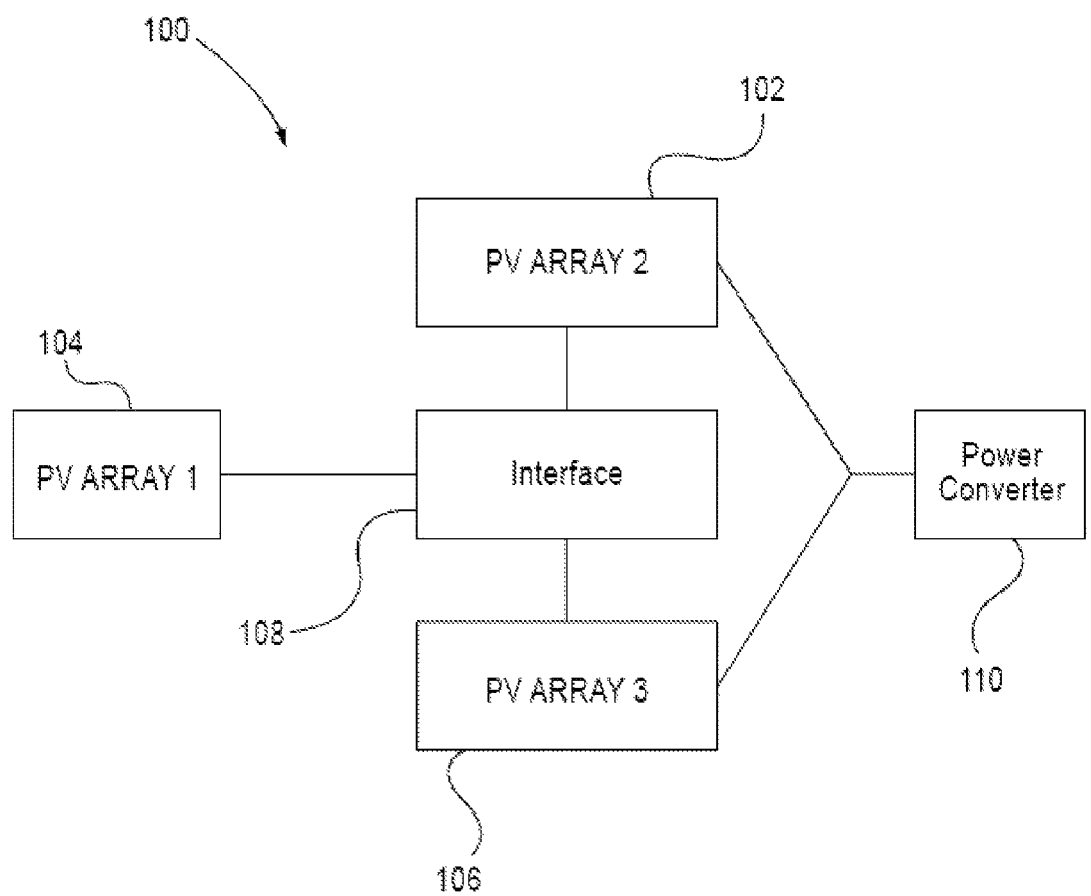
FIG. 1 is a block diagram depicting an exemplary embodiment of a photovoltaic system.

Referring now to the drawings, where like or similar elements are designated with similar reference numerals throughout the several views, and referring in particular to FIG. 1, it is a block diagram depicting a photovoltaic (PV) system 100, that includes a first photovoltaic array 104 coupled to a second photovoltaic array 102 and a third photovoltaic array 106 via a photovoltaic interface 108. As shown, the second and third photovoltaic arrays 102, 104 are also coupled to a power converter 110.

In general, the three photovoltaic arrays 102, 104, 106 convert solar energy to DC electrical power, and the power converter 110 is configured to convert the DC power from one form to another form. For example, the power converter 110 may be a DC to DC power converter that is adapted to either increase or decrease the DC voltage that is output from the arrays 102, 104, 106. And in other embodiments, the power converter may be an inverter, which converts the DC power from the arrays 102, 104, 106 to AC power (e.g., three-phase power). The PV interface 108 generally operates to enable the first, second and third photovoltaic arrays 104, 102, 106, to supply voltage to the power converter 110 at an input voltage while keeping the power converter 110 input voltage lower than +/−600V DC relative to ground, or lower than 1200V DC total rail-to-rail.

In one embodiment, the PV interface 108 is used during mid-day start ups to gradually load the first array 104 and gradually supply voltage from the first PV array 104 to the power converter 110. In some embodiments for example, a switching segment in the PV interface 108 operates for one, or just a few, second(s) during system startup. A portion of the switching segment may be pulse width modulated from a low duty cycle to a high duty cycle to gradually load the first PV array 104, and as a consequence, the gradual loading of the first array 104 pulls down the voltage of the first array 104 so that the voltage of the series combination of the three arrays 102, 104, 106 stays within an acceptable voltage level for the power converter 110 while preventing the voltage of any one of the arrays 102, 104, 106 from exceeding +/−600 VDC relative to ground.

Once the first PV array 104 is loaded, the interface 108 may bypass the switching segment by closing a first contactor, which is adapted to place the first PV array 104 in series with the second and third PV arrays 102, 106. As a consequence, in many embodiments, the power converter 110 receives a voltage from three PV arrays 102, 104, 106 (e.g., 1200 VDC) that is greater than the voltage received with two PV arrays (e.g., 800 VDC), yet the voltage that is applied to the power converter is held at or below a threshold voltage (e.g., +/−600V DC) relative to ground. The increased voltage that is applied to the power converter 110 is an improvement over the prior art because there is less current loss (e.g., due to the higher voltage) than prior architectures and yet, the voltage of any single line is held below the threshold (e.g., +/−600 VDC relative to ground), which is often required (e.g., by electrical code) in the industry. Although an exemplary threshold voltage of +/−600 VDC is utilized throughout this disclosure, one of ordinary skill will appreciate that it is contemplated that, depending upon the context, other maximum voltages may govern the threshold voltage.

As discussed further herein, upon electrically coupling the first PV array 104 to the second and third PV arrays 102, 106, the three PV arrays 102, 104, 106 generally operate as a bi-polar array, with the second PV array 102 disposed to operate at a positive voltage with respect to ground, the third PV array 106 disposed so as to operate below ground, and the first PV array 104 operating above and below ground potential. For example, a positive node of the second PV array 102 may be coupled to the power converter 110 and a negative node of the third PV array may be coupled to the power converter 110. The first PV array 104 may be electrically coupled to (i) the negative node of the second PV array 102, which is generally disposed above ground potential, and (ii) the positive node of the third PV array 106, which is generally disposed below ground potential.

In addition to electrically coupling the first PV array 104 to the second and third PV arrays 102, 106, the interface 108 enables low cost and efficient power converters 110 to be utilized in connection with efficient, high voltage PV arrays 102, 104, 106. For example, instead of utilizing 1800 Volt silicon (e.g., in IGBTs of the power converter) to accommodate 1800 Volt open-load voltages across three PV arrays, 1200 Volt silicon may be implemented in the power converter 110, which possesses a lower cost than 1800V silicon. Furthermore, the PV system 100 is generally operated more efficiently than other bi-polar arrays (e.g., bi-polar arrays that operate between 800 VDC and 900 VDC) since the system will operate nearer the 1200V rating of the silicon.

Figure 2:
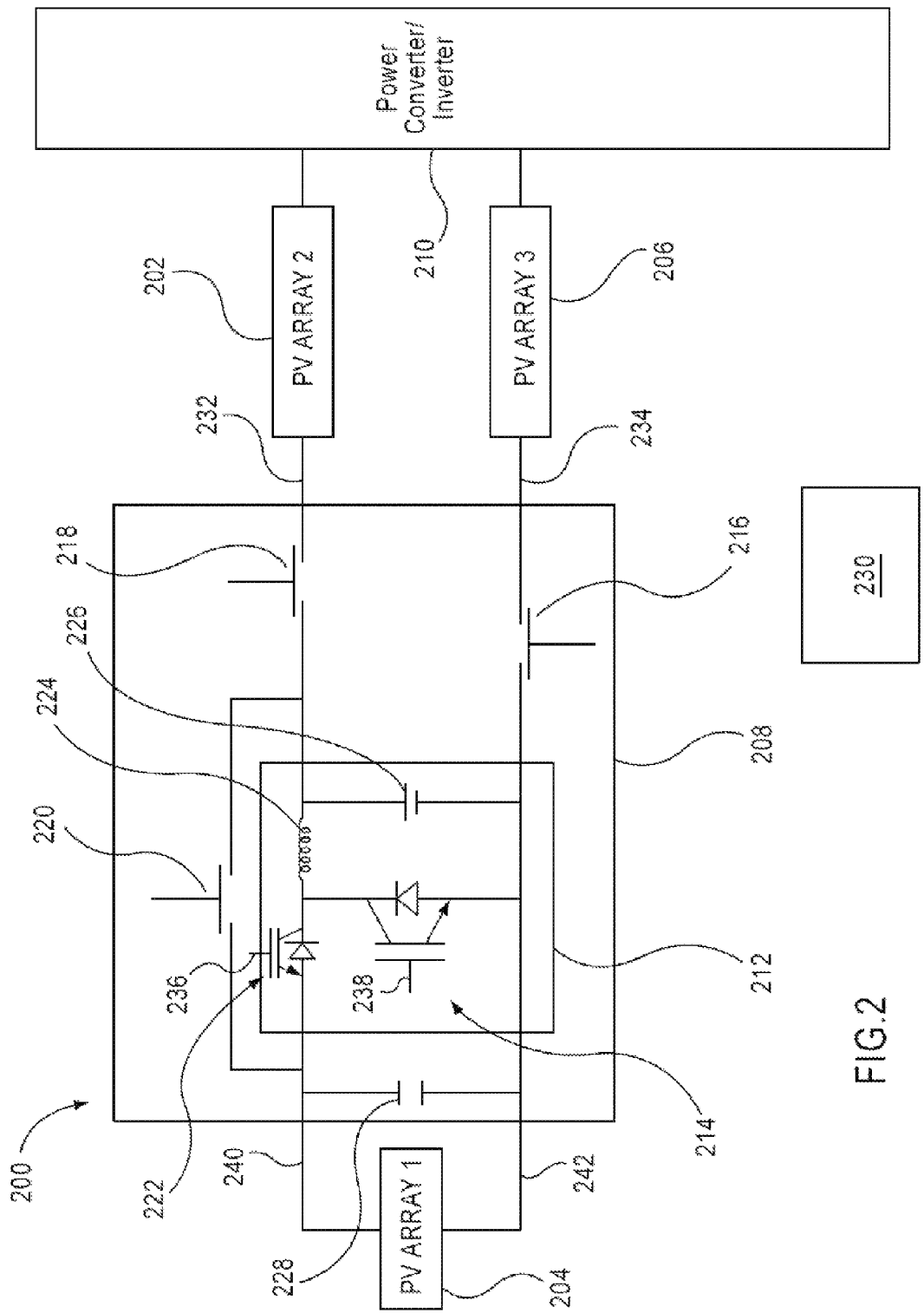
FIG. 2 is a schematic representation of an exemplary embodiment of the system described with reference to FIG. 1.

Referring next to FIG. 2, shown is a schematic representation of an exemplary embodiment of the system 100 described with reference to FIG. 1. As shown in the system 200 depicted in FIG. 2, a first photovoltaic array 204 is coupled by inputs 240, 242 to an exemplary interface 208 that includes a switching segment 212 (also known as a buck regulator). The buck regulator comprises a series switch 222 and an isolation switch 214 arranged and configured, along with other switching segment and interface features, to couple the first photovoltaic array 204 in series with the second and third photovoltaic arrays 202, 206 without the power converter 210 being exposed to greater than +/−600V DC. For example, a series inductor 224 and a first capacitor 226 work to short the first PV array 204, while a second capacitor 228 is adapted to help control the voltage supplied by the first PV array 204.

As shown, the isolation switch 214 is disposed across the positive and negative rails of the first photovoltaic array 204 (the positive and negative rails may also be referred to as the first and second rails). It is to be appreciated that in many embodiments, the isolation switch 214 is an insulated-gate bipolar transistor (IGBT) disposed so that a collector-emitter current path of the IGBT is coupled between the positive and negative rails of the first photovoltaic array 204 and the gate of the isolation switch is electronically coupled to a control segment 230 of the interface 208. In other embodiments, however, the isolation switch 214 may be implemented by other switching and control technologies without departing from the scope of the claimed invention.

The series switch 222 in one embodiment is arranged in parallel, along a positive rail of the system 200, with a first contactor 220. It is to be appreciated that in many embodiments, the series switch 222 is an insulated-gate bipolar transistor (IGBT) disposed so that a collector-emitter current path of the IGBT is coupled along the positive rail of the first photovoltaic array 204 and the gate of the series switch is electronically coupled to the control segment 230 of the interface 208. In other embodiments, however, the series switch 222 is implemented by other switching and control technologies without departing from the scope of the claimed invention. It is to be appreciated that the first contactor 220 may also be electronically coupled to the control segment 230 of the interface. Although not depicted, the series switch 222 and first contactor 220 in many alternative implementations may be arranged in parallel, along the negative rail between the first array 204 and the third array 206.

In one embodiment, the control segment 230 is realized by a processor that is configured to execute instructions stored in a memory, but this is not required, and in other embodiments, the control segment is realized by hardware. It is also contemplated that the control segment in yet other embodiments is implemented by a combination of hardware, software, and/or firmware. It should also be realized that the depiction of the control segment 230 in FIG. 2 is merely logical and the interface 208 may be controlled by control components that are distributed within and/or outside of the interface. For simplicity, connections between the control segment 230 and other portions (e.g., switching segment 212) of the system 200 are not depicted, but one of ordinary skill in the art will appreciate that the control segment 230 may be coupled to the controlled components depicted in FIG. 2.

Often, the switching segment 212 is not utilized during non-midday start ups because the voltage generated by the series combination of the first, second, and third PV arrays 202, 204, 206 (e.g., when the sun is rising) is less than the voltage generated by the series combination of the first, second, and third PV arrays 202, 204, 206 during midday. Therefore, during a non-midday start-up, the first PV array 204 may often be electrically coupled to the second and third PV arrays 202, 206 in series through the first contactor 220 because a collective voltage across the three series PV arrays 202, 204, 206 is less than a voltage that is damaging to the power converter 210.

Figure 4A:
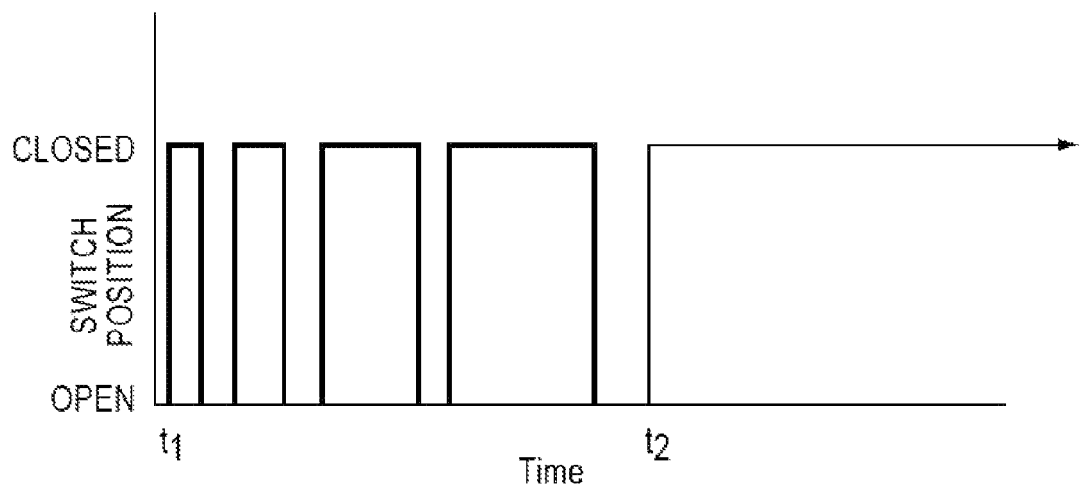
FIG. 4A is a graph depicting, as a function of time, a position of series switch depicted in FIG. 2.
Figure 4B:
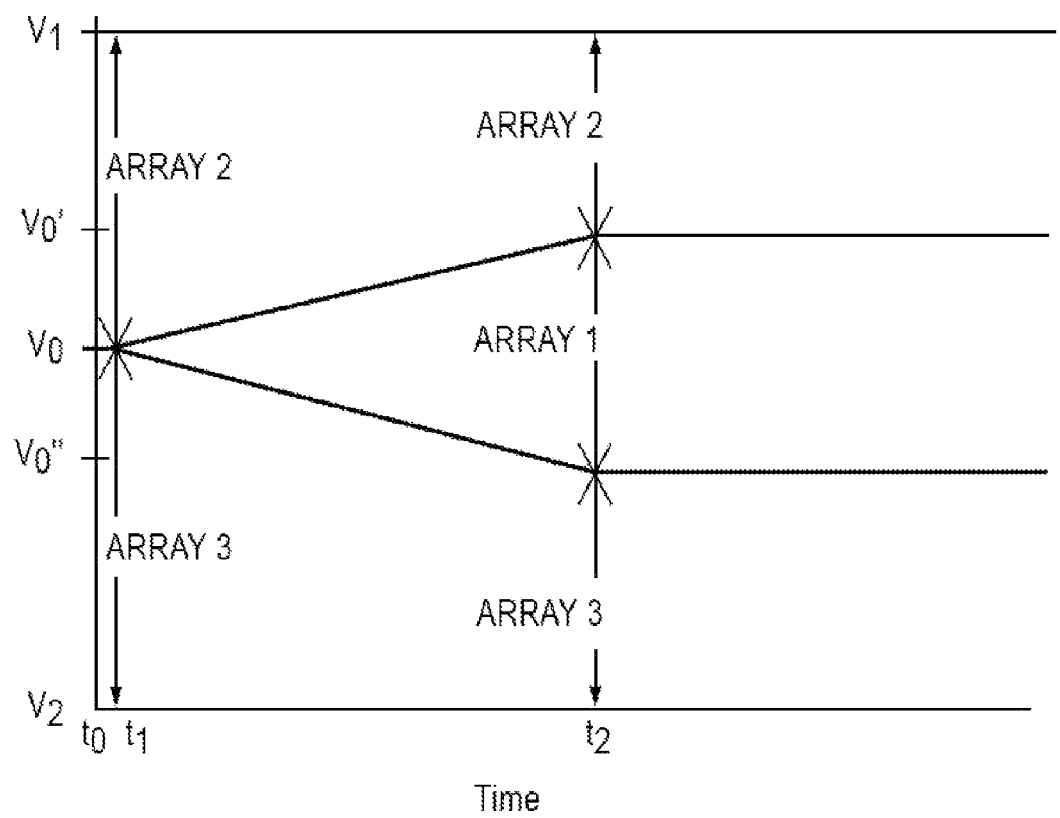
FIG. 4B is a graph depicting, as a function of time, a voltage of a first, second, and third photovoltaic arrays depicted in FIG. 2.

During a midday start up, however, the series combination of the open load voltages of the arrays 202, 204, 206 may exceed the maximum voltage of a converter (e.g., converter 210). Referring to FIG. 4B or exemplary purposes, assuming the collective voltage (between $V_1$ and $V_2$) represents the maximum voltage at which a power converter (e.g., power converter 210) may operate, and at $t_0$ the second and third arrays 202, 206 are not loaded, but are tied together in series (e.g., the first array 204 is isolated), the series combination of the open load voltages of the second and third arrays 202, 206 is already at, or near, the maximum voltage for the converter. As a consequence, adding the open load voltage of the first array 204 in series combination with the open load voltages of the second and third arrays 202, 206 would cause the open-load voltage of the series combination of the three arrays 202, 204, 206 to exceed the designed operating voltage of the power converter 210.

As a consequence, in many modes of operation, the interface 208 operates to gradually couple the first photovoltaic array 204 the array 204) to the power converter 210 so that the power converter 210 is not exposed to the potentially damaging voltage (e.g., an open load voltage) of the first, second and third photovoltaic arrays 202, 204, 206. The interface 208 is further adapted to keep the maximum voltage across any one line at a level that is not greater than +/−600V DC. Referring to FIGS. 4A and 4B, for example, shown are graphs depicting, as a function of time, a position of the series switch 222 and a collective voltage (between $V_1$ and $V_2$) of the three arrays 202, 204, 206, respectively.

Prior to an exemplary midday start-up process, each of the first, second and third photovoltaic arrays 204, 202, 206 may possess an open load voltage of about +/−600V DC relative to ground. In several embodiments (e.g., when the power converter 210 is capable of handling +/−600 VDC or 1200 Volts rail-to-rail), the second array 202 and the third array 206 may be placed online without concern for damaging the power converter 210. As a consequence, in many embodiments, the second and third arrays 202, 206 are initially arranged in series to apply a voltage across the power converter 210 while the first array 204 remains offline.

In the embodiment depicted in FIG. 2, for example, the second and third contactors 218, 216, and the isolation switch 214 are initially closed, and the first contactor 220 and the series switch 222 are initially open so as to place a series arrangement of the second and third arrays 202, 206 across the power converter 210. As shown in the exemplary embodiment depicted in FIG. 2, the second and third contactors 218, 216 may be coupled to first and second interface outputs 232, 234, respectively.

And with reference to FIG. 4B by way of further example, between time $t_0$ and $t_1$ (when the first array 204 is offline) the collective voltage (the voltage depicted between $V_1$ and $V_2$) that is applied to the converter 210 is due to the series combination of the voltage of the second array 202 (the voltage depicted between $V_1$ and $V_0$) and the voltage of the third array 206 (the voltage depicted between $V_2$ and $V_0$).

As shown in FIGS. 2 and 4A, at time $t_1$ (e.g., nearly immediately after start-up) the series switch 222 is closed briefly. In this exemplary mode of operation, a signal 236 (e.g., from control segment 230) to the series switch 222 is pulse-width modulated so that the series switch 222 is closed for successively longer amounts of time between times $t_1$ and $t_2$ so as to gradually load the arrays 202, 204, 206. Similarly, a signal 238 (e.g., from control segment 230) to the isolation switch 214 is pulse-width modulated so that the isolation switch 214 is opened during the periods the series switch 222 is closed. So, prior to time $t_1$, there is 100% duty cycle on the isolation switch 214 and 0% duty cycle on the series switch 222, while at time $t_2$, there is 0% duty cycle on the isolation switch 214 and 100% duty cycle on the series switch 222.

From time $t_1$ to $t_2$, and as shown in FIGS. 2 and 4B, as the second and third photovoltaic arrays 202, 206 are loaded, the voltage supplied to the power converter 210 from the second and third photovoltaic arrays 202, 206 starts to decrease from an initial open load voltage towards an operating voltage. More specifically, FIG. 4B shows the initial voltage supplied by the second photovoltaic array 202 as $V_1$-$V_0$, decreasing to operating voltage $V_1$-$V_{0'}$, and the initial voltage supplied by the third photovoltaic array 206 is $V_2$-$V_0$, decreasing to operating voltage $V_2$-$V_{0'''}$. During this time from time $t_1$ to $t_2$, the initial voltage supplied by the first photovoltaic array 204 increases from an initial voltage of 0 V DC to an operating voltage of $V_{0'}$-$V_{0''}$. As a consequence, once the first array 204 is completely online and the series combination of the three arrays are loaded (e.g., at $t_2$), each of the voltages applied by the arrays 202, 204, 206 is approximately the same (e.g., 400 VDC, but they need not be equal) and the collective voltage of the three arrays 202, 204, 206 when the three arrays are load is approximately equal to the open load voltage of the second and third arrays 202, 206 (e.g., at time $t_1$).

In some embodiments the voltage $V_1$ depicted in FIG. 4B is approximately +600V DC, $V_{0'}$ is approximately +200V DC, $V_0$ is approximately 0V, $V_{0''}$ is approximately −200V DC, and $V_2$ is approximately −600V DC. In many embodiments, once the voltage output by the first photovoltaic array 204 achieves a desirable level (e.g., an optimal level for power transfer), the first contactor 220 is closed, routing current around the buck regulator 212 and through the first contactor.

In variation of the interface 208 depicted in FIG. 2, the switching segment 212 may be replaced by a second contactor and an inductor that are arranged in series between the input 240 and output 232 (or between input 242 and output 234) and the capacitor 228 may be removed. In this embodiment, to bring the first array 204 online, the second contactor is closed, and contactors 218, 216 are closed to take the array 204 off of ground. As a consequence, a negative voltage will exist across the inductor, which is in series with the first array 204; thus the voltage of the first array 204 (e.g., 600 VDC) will be offset by the initial voltage (e.g., −500 VDC) across the inductor so that the full open load voltage of the first array 204 is not applied between the second 202 and third 206 arrays.

Figure 3:
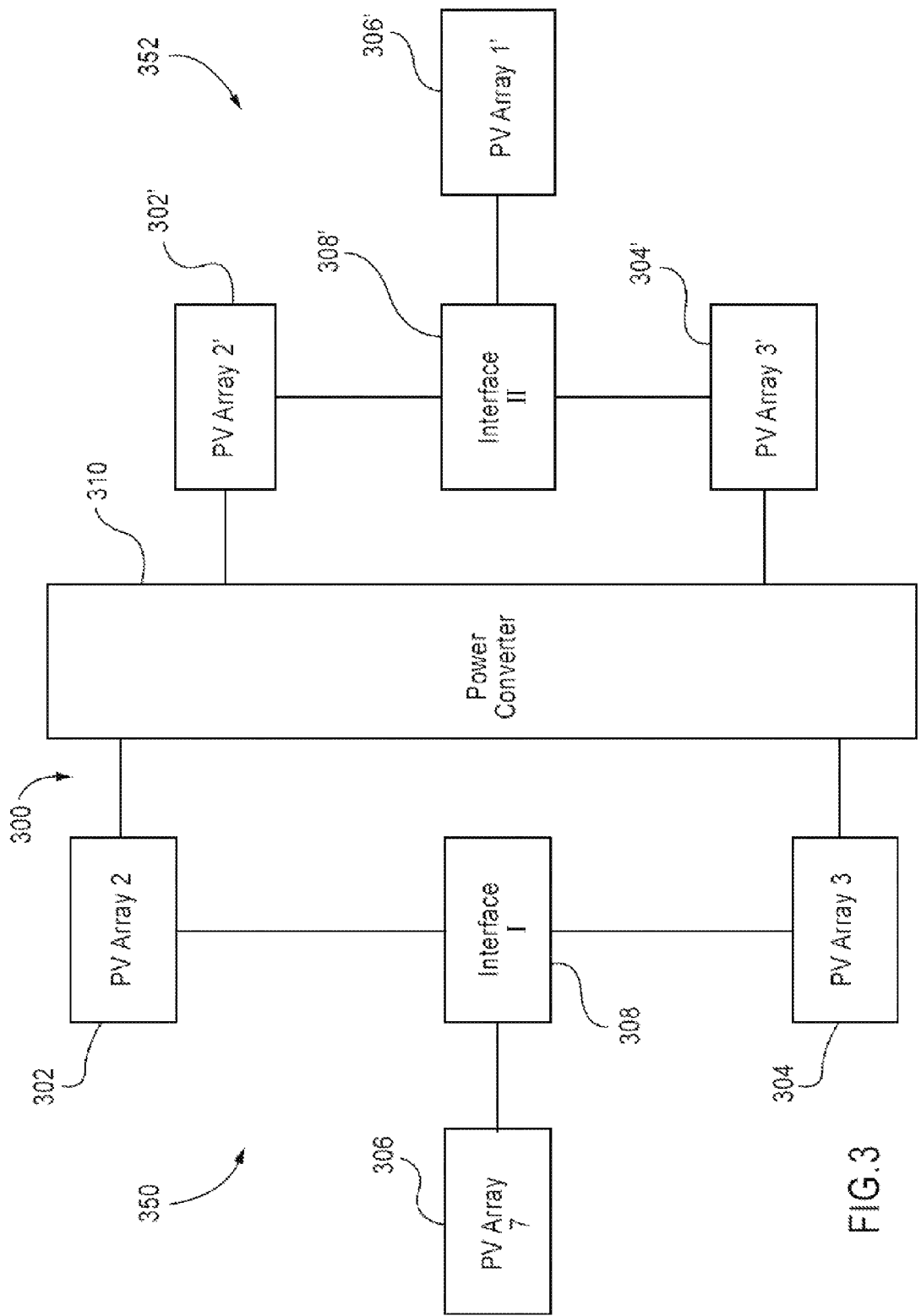
FIG. 3 is a block diagram of another exemplary embodiment of a photovoltaic system.

Referring next to FIG. 3, shown is an exemplary PV system 300 having a power converter 310 adapted to electrically couple to a first PV array interface system 350 and a second PV array interface system 352. Each of the first and the second PV array interface systems 350, 352 are similar to the systems described and shown in FIGS. 1 and 2. In this embodiment, the arrays 302, 204, 306 of the first system 350 and the arrays 302', 304', 306' of the second system 352 may be coupled in parallel at or near the power converter 310, and the first and second interface systems 350, 352 may be remotely located from each other, and each system 350, 352 may be remotely located from the power converter 310.

Figure 5:
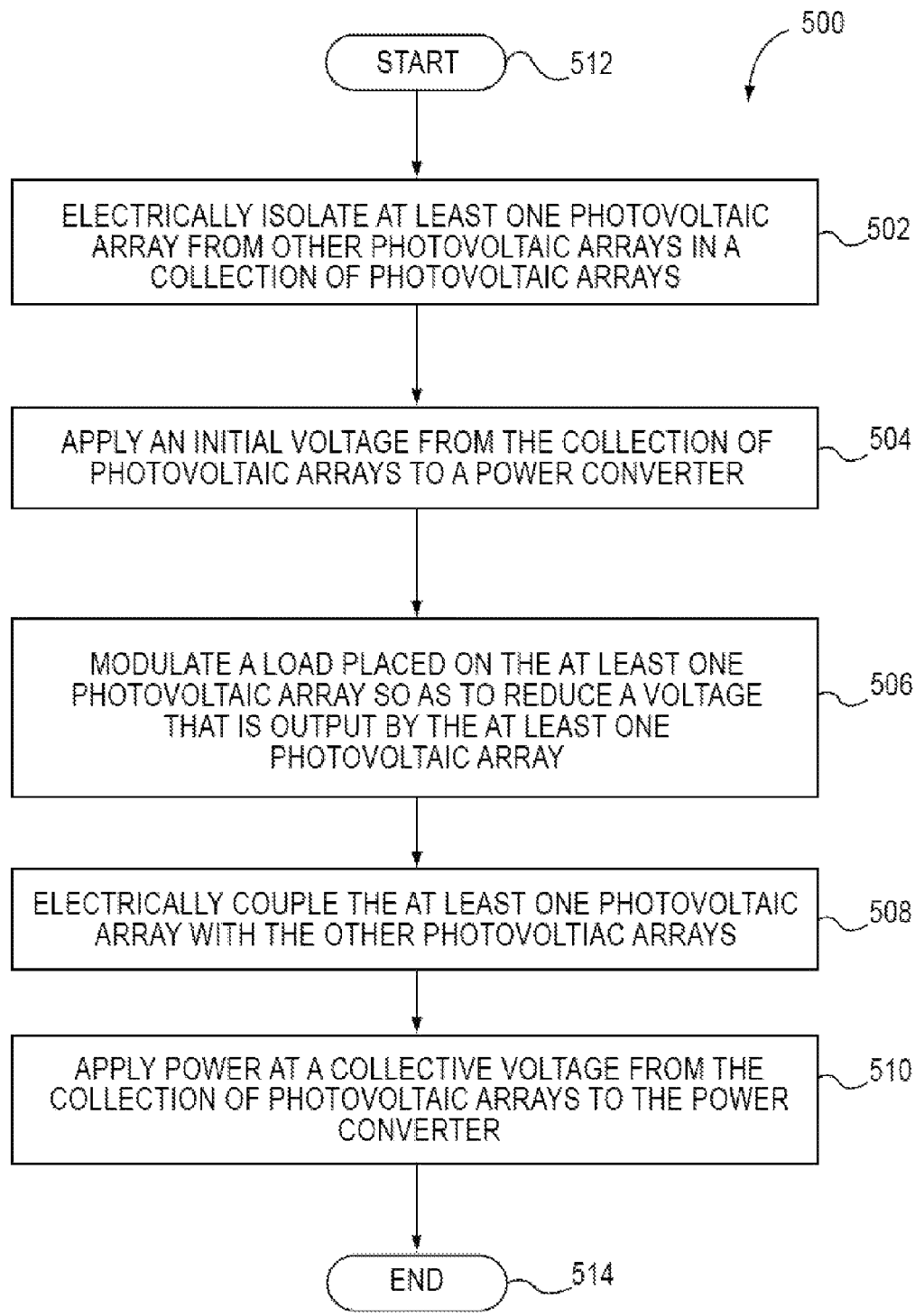
FIG. 5 is a flowchart depicting an exemplary method that may be carried out in connection with the embodiments discussed with reference to FIGS. 1-4B.

Referring next to FIG. 5, shown is a flowchart 500 depicting an exemplary method that may be carried out in connection with the embodiments discussed with reference to FIGS. 1-4. As shown, initially at least one photovoltaic array (e.g., array 104) is electrically isolated from other photovoltaic arrays (e.g., arrays 102 and 106) in a collection of photovoltaic arrays (e.g. arrays 102, 104, 106), as an initial voltage (e.g., open load voltage) is applied from the collection of photovoltaic arrays to a power converter (e.g., power converter 110) (Blocks 502, 504). A load placed on the at least one photovoltaic array is then modulated (e.g., pulse-width modulated) so the at least one photovoltaic array outputs a voltage that lowers from the initial voltage to an operating voltage, and upon electrically coupling the at least one photovoltaic array with the other arrays, becomes a part of a collective voltage applied to the power converter. (Blocks 506, 508, 510). As discussed, in some embodiments a buck regulator (e.g., buck regulator 212) that includes a series switch (e.g. series switch 222) and an isolation switch (e.g. isolation switch 214) is utilized to modulate a load that is placed on the at least one photovoltaic array so as to maintain the voltage of any rail—with respect to ground—at or below a maximum level (e.g., maximum regulatory level).

Figure 6A:
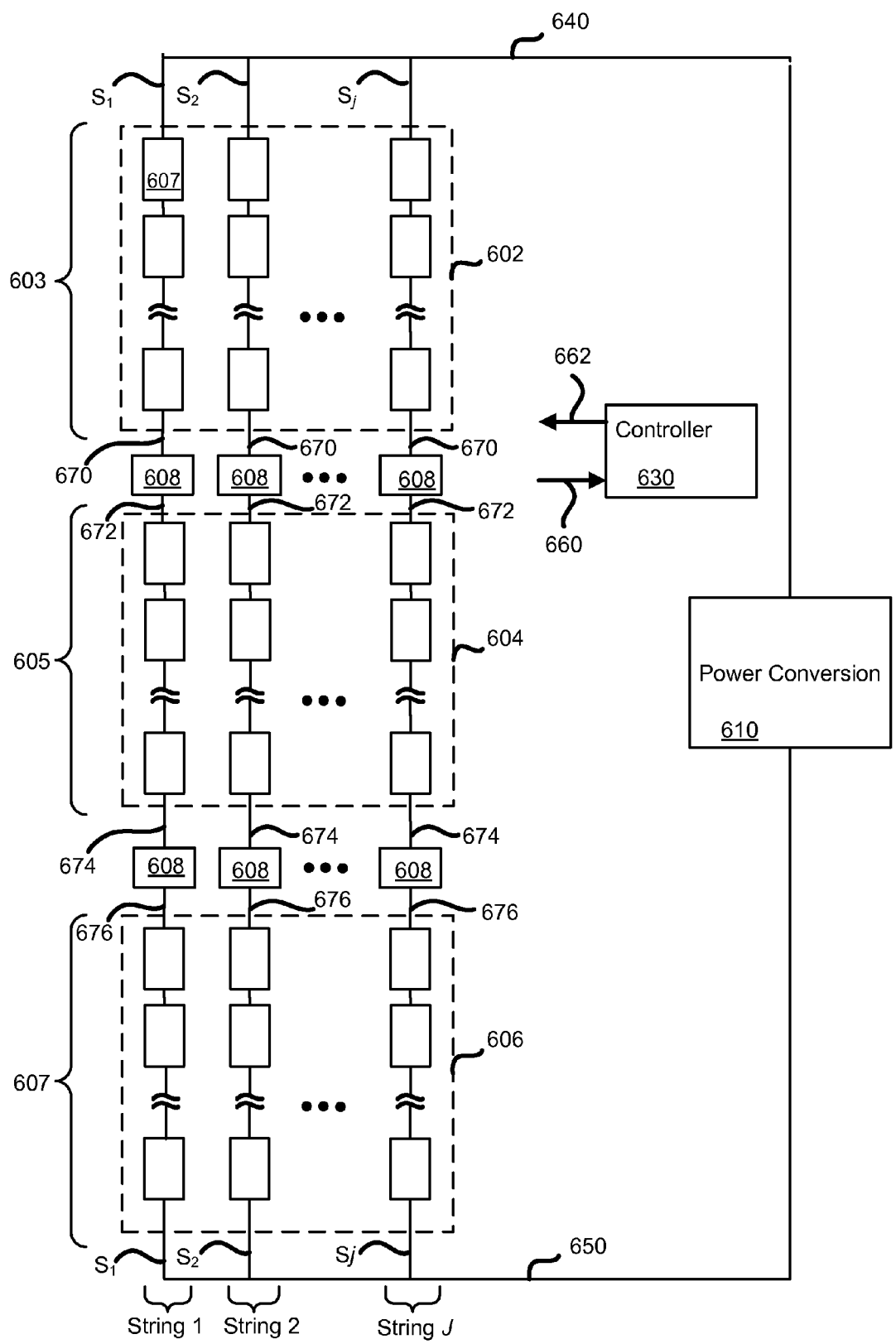
FIGS. 6A and 6B illustrates exemplary embodiments of a photovoltaic system.
Figure 6B:
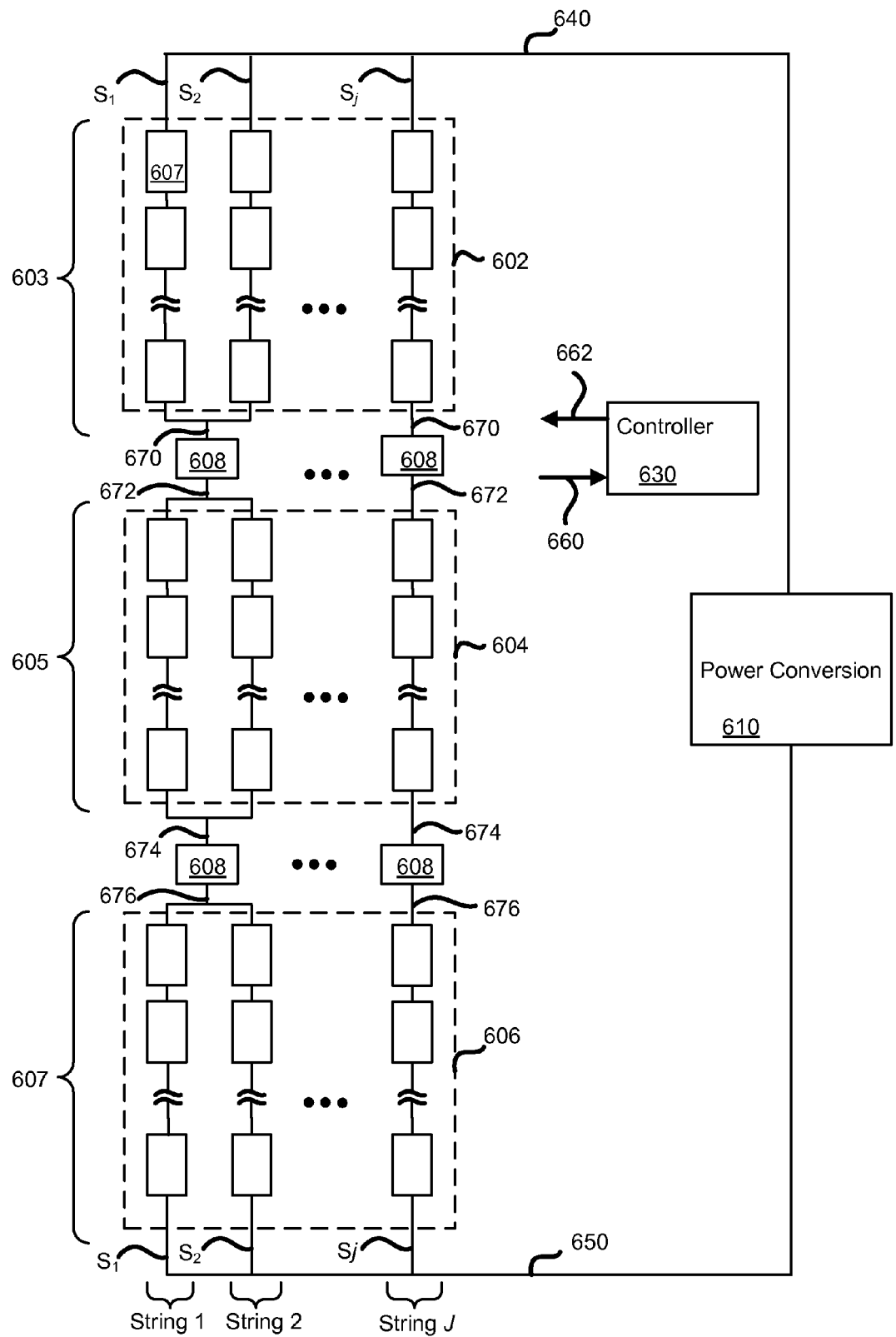

Referring next to FIGS. 6A and 6B, shown are schematic depictions of exemplary embodiments that include J strings ($S_1$ through $S_J$), which are arranged in parallel, and each of the strings $S_{1-J}$ includes two or more sections. In the exemplary embodiments depicted in FIGS. 6A and 6B, each of the strings includes three sections: a first section 605, a second section 603, and a third section 607, but in alternative implementations each of the strings $S_{1-J}$ may be divided into two sections, or each of the strings $S_{1-J}$ may be divided into four or more sections. As shown, each of the portions of the strings $S_{1-J}$ in the first section 605 may collectively be referred to as a first array 604; each of the portions of the strings $S_{1-J}$ in the second section 603 may collectively be referred to as a second array 602; and each of the portions of the strings $S_{1-J}$ in the third section 607 may collectively be referred to as a third array 606.

And as shown, each of the strings $S_{1-J}$ includes a plurality of photovoltaic panels 607 (e.g., 24V or 100V panels), and disposed in series with the panels 607 within each string $S_{1-J}$ are two distributed array devices 608. More specifically, each string $S_{1-J}$ includes a set of two distributed array devices 608, which divide each of the strings $S_{1-J}$ into the three portions 603, 605, 607, and each of the three portions 603, 605, 607 are within one of the three arrays 602, 604, 606. Thus, the distributed array devices 608 tie array 602 to array 604, and tie array 604 to array 606 by tying respective portions of each string together. Also shown is a power conversion component 610 (e.g., an inverter or DC to DC converter) that is coupled to the strings in array 602 via a positive rail 640 and the strings in array 606 via the negative rail 650. In addition, a controller 630 is in communication with the distributed array components 608 via control signals 662 sent to the devices 608 (e.g., by wireless, wire line, or power line carriers) and optional tie information 660 (e.g., status information that may include switch status, voltage values, and current values) is received from the distributed array devices 608.

In some implementations, the panels 607 are panels that apply 100 Volts open circuit, and there may be nine 100 Volt panels in each string $S_{1-J}$. In other embodiments, there may be thirty panels in each string $S_{1-J}$ that each operate at 36 Volts open circuit. And for a 500 kW system, there may be approximately 80 strings, and each string $S_{1-J}$ may provide about 7 Amps.

In general, each of the distributed array devices 608 operates, on demand, to couple and decouple one or more strings (but less than all of the strings) to the power conversion component 610. In the embodiment depicted in FIG. 6A for example, the distributed array devices 608 in string $S_1$ operate to couple and decouple string $S_1$ to the power conversion component 610, and the distributed array devices 608 in string $S_2$ operate to couple and decouple string $S_2$ to the power conversion component 610.

More specifically, again with reference to string $S_1$ in the embodiment depicted in FIG. 6A, the distributed array device 608 coupled between the portion of string $S_1$ in section 603 and the portion of string $S_1$ in section 605 couples and decouples the first section 605 of string $S_1$ and the second section 603 of string $S_1$. Similarly, the distributed array device 608 coupled between the portion of string $S_1$ in section 607 and the portion of string $S_1$ in section 605 couples and decouples the third section 607 of string $S_1$ and the first section 605 of string $S_1$. As a consequence, when the distributed array devices 608 in string $S_1$ have decoupled the sections 603, 605, and 607, current does not flow though string $S_1$ and string $S_1$ is decoupled from the power conversion component 610.

In the embodiment depicted in FIG. 6B, at least some of the distributed array devices 608 operate to simultaneously couple and decouple two or more strings from $S_{1-J}$ from the power conversion component 610. As depicted in FIG. 6B a single distributed array device 608 operates to couple and decouple the portions of strings $S_1$ and $S_2$ in section 603 to the portions of strings $S_1$ and $S_2$ in section 605. As a consequence, two or more strings may be simultaneously coupled to the power conversion component 610, and the number of distributed array devices 608 that are needed to implement the system may be reduced (as compared to the embodiment described with reference to FIG. 6A).

Stated another way, each of the distributed array devices 608 generally operates, on demand, to couple and decouple portions of two of the arrays 602, 604, 606 (along a particular one of the strings $S_{1-J}$, as shown in FIG. 6A, or along two or more strings as shown in FIG. 6B) so as to make and break a current path between the positive and negative rails 640, 650 through the particular string (or strings in the embodiment depicted in FIG. 6B) at a location between a portion of two of the arrays 602, 604, 606. In many variations the distributed array devices 608 are self powered (e.g., by a panel of the string), are radio or power-line controlled, communicate voltage and current information, and optionally communicate their state (also referred to herein as tie status) (e.g., in conduction or blocking).

When the system is running, the arrays 602, 604, 606 are applying power to the power conversion component 610, and the distributed array devices 608 are conducting current. When the system is idle, the distributed array devices 608 are all open and blocking current. Beneficially, in the embodiment depicted in FIG. 6A, labor costs associated with combining strings are substantially reduced. For example, since the outputs 670, 672, 674, and 676 of the strings of the arrays 602, 604 and 606 do not need to be combined, a substantial amount of labor costs are avoided. But if two or more strings may be easily combined (e.g., if two strings share the same rack), the labor associated with tying two or more strings together (e.g., strings $S_1$ and $S_2$ shown in FIG. 6B) may be more than offset by the costs saved by reducing the number of distributed array devices 608.

Another feature of the embodiments depicted in FIGS. 6A and 6B is that during startup, since all the strings in each array are not combined, strings $S_{1-J}$ may be connected to power converter 610 in a time sequence so that full arrays do not come on simultaneously (in other words only a subset of all the strings $S_{1-J}$ are coupled to the power conversion component 610 simultaneously). This allows the power converter 610 to operate within its rated voltage limits while the strings $S_{1-J}$ (or sets of two or more strings as depicted in FIG. 6B) are brought online sequentially. In many variations of the embodiment of FIG. 1, during start up, two combined full arrays come online initially, but the remaining single combined array is connected between the other two arrays by pulse-width-modulating the connection so that the power converter remains operating within its rated voltage limits during startup. Although each embodiment works well, depending upon the implementation, one embodiment may be preferred over the other embodiment.

In some variations of the embodiments depicted in FIGS. 6A and 6B, each of the arrays 602, 604, 606 is configured, under typical open load conditions, to apply approximately 400 Volts, and when loaded, each of the arrays 602, 604, 606 applies approximately 333 Volts. Relative to ground, the positive rail 640 (the positive side of the array 602) is about +500 Volts and the negative rail 650 (the negative side of the array 606) is about −500 Volts. Thus, there is no voltage, relative to ground, that exceeds 600 Volts. As a consequence, these embodiments are useful in environments where regulatory code limits voltages relative to ground. For example, the sum of the open voltages (Voc) of the arrays 602, 604, 606 (e.g., 1200 Volts) may be well over what the power converter is rated to handle, but at no time does the voltage of any array exceed 600 Volts, and these potentially-damaging open voltages are not applied to the power converter 610. Thus, equipment that is designed to operate at 600V or less may be coupled to arrays that have a summation of open-circuited voltage that may be 1200V.

Figure 7:
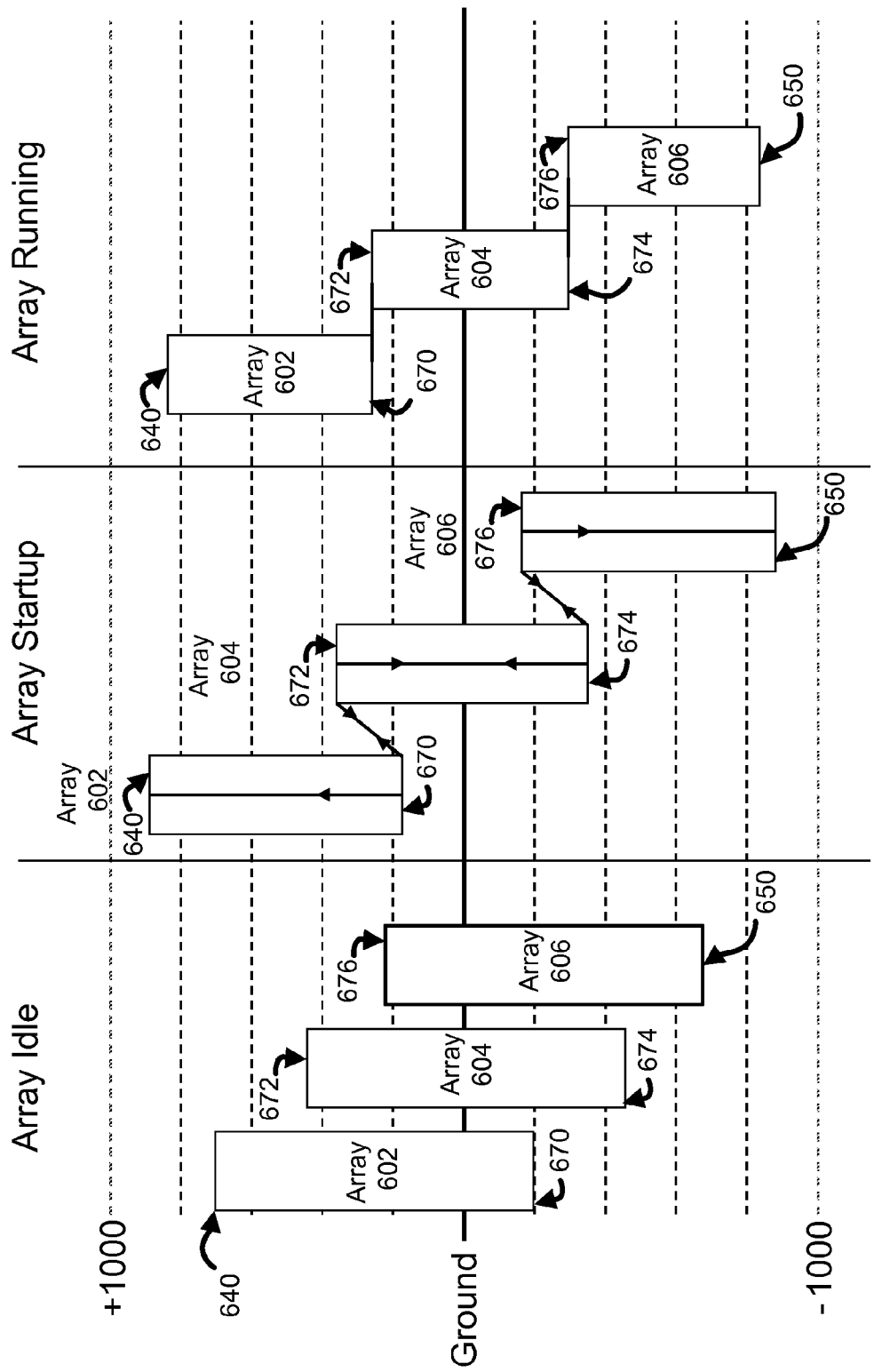
FIG. 7 is a graph depicting idle mode, startup transition, and running mode of the strings in the photovoltaic system of FIG. 6.

It is certainly contemplated that higher voltages may be utilized. Referring to FIG. 7 for example, shown is a graph depicting voltages across the three arrays 602, 604, 606, which is divided into three portions to depict three operating states of the arrays 602, 604, 606: 1) idle mode, 2) startup, and 3) running mode. It should be noted that the voltages depicted in FIG. 7 are merely exemplary and that the general operating attributes of the system, which are depicted in FIG. 7, also apply to lower and higher voltages.

As shown in FIG. 7, during idle mode, relative to ground, the positive rail 640 (the positive side of the array 602) may be about 700 Volts and the negative rail 650 (the negative side of the array 606) may be about −700 Volts. Array 604 is floating about ground, and the voltage at the positive output 672 of the array 604 is about +450 Volts and the voltage at the negative output of the array 604 is approximately −450 Volts. In this idle state, the distributed array devices 608 are switched open so that the three arrays 602, 604, 606 are separated. As discussed with reference to FIG. 9, the voltages of the arrays 602, 604, 606 rest at the depicted values in FIG. 7 due to the arrays 602, 604, 606 being coupled to ground via resistances (e.g., resistances that are inherent in voltage sensors within the distributed array devices 608).

As depicted in FIG. 7, during the idle mode there a state of string section voltage overlap exists; thus reducing the overall voltage range of the arrays 602, 604, 606. For example, in each of the separated strings $S_{1-J}$ a voltage overlap between the separated string sections in each of the photovoltaic strings so that, within each photovoltaic string, some voltages along one of the string sections are the same as some voltages along another one of the string sections. Referring to FIGS. 6A, 6B, and 7, for example, in idle mode there are voltages in the first section 605 of string $S_1$ that are the same as a voltages in the second and third sections 603, 607 of string $S_1$.

During startup, as the distributed array devices 608 in each string $S_{1-J}$ are closed (e.g., sequentially closed) current conducts through each string $S_{1-J}$ between the positive rail 640 and the negative rail 650. The power conversion component 610 immediately loads the string that comes online and drops the string's open circuit voltage to a voltage within limits of the rating of the power conversion component. In the "array startup" phase in FIG. 7 for example, some of the strings $S_{1-J}$ are coupled to the power conversion component 610, which drops the voltages at the rails 640, 650 and drops the voltages at the outputs 672, 674 of the first array 604. And as more and more strings $S_{1-J}$ are coupled to the power conversion component 610, the voltages approach the voltages depicting in the "array running" mode. As shown in FIG. 7 when all of the strings $S_{1-J}$ are online with the power conversion component 610 during the running mode, the voltages across the three portions of the strings in arrays 602, 604 and 606 divide substantially into three equal portions. During the startup transition from idle to running mode as illustrated in FIG. 7, when a string is brought online across the rails 640, 605 a voltage at output 670 of the string portion in array 602 jumps to match the voltage at output 672 of the string portion in array 604. At the same time voltage at output 674 of the string portion in array 604 jumps to match the voltage at output 676 of the string portion in array 606.

As discussed, in several modes of the startup operation, fewer than all of the strings $S_{1-J}$ are initially brought online so that the current and power that is applied to the power conversion component 610 is limited. In these embodiments for example, the controller 630 sends control signals 662 to selected ones of the distributed array devices 608 to stagger the closing of the distributed array devices 608 so that less than all of the strings $S_{1-J}$ are closed at once. And as shown in FIG. 7, the extent of the voltage overlap between the sections of each photovoltaic string is reduced after each successive coupling, until all the photovoltaic strings are brought online, and when all the photovoltaic strings are online (in the running mode), the voltage overlap does not exist (e.g., each of the series-arranged photovoltaic panels operates at a different voltage than other ones of the photovoltaic panels).

In some embodiments for example, the strings $S_{1-J}$ may be sequentially brought online so that first, a set of two distributed array devices 608 in string $S_1$ are closed first, followed by a short delay (e.g., 0.5 Seconds) before a set of distributed array devices 608 in string $S_2$ are closed, and so on until all the distributed array devices 608 in the strings $S_{1-J}$ are closed. In this way, first one string applies power to the power conversion component 610, then two strings apply power to the power conversion component 610, then three strings apply power to the power conversion component 610 and so on. In some modes of operation, after each string comes online, power conversion component 610 evaluates whether it is operating at full power, and if so, the power conversion component 610 raises a voltage across the rails 640, 650 so as to reduce the operating current.

It is also contemplated that, if the power conversion component 610 is capable of handling the power, that more than one of the strings may be brought online at a time. As depicted in FIG. 6B for example, two or more strings (strings $S_1$ and $S_2$) may be brought into service at substantially the same time, and then another two or more strings may be brought into service, and so on until all the strings $S_{1-J}$ are in service. The array startup period may occur over about a second to a few seconds, but this time may vary depending upon the number of strings, the level of power that the power conversion component 610 may handle, and the number of strings simultaneously brought into service.

In many implementations, the distributed array devices 608 are powered by a separate power supply or they are self-powered by a DC-DC optimization device. For example, if there are 30 panels in a string, the $9^{th}$ and $21^{st}$ panels may power the distributed array devices 608, and those panels may be optimized for power. Alternatively, panel optimizers could be implanted on each panel, but this may be prohibitively expensive and is not required.

Although three arrays are depicted in the embodiment depicted in FIG. 6, it is certainly contemplated that in general N arrays may be utilized in connection with N−1 distributed array devices in each string, where N is 3 or more. But in many implementations three arrays is an optimum number of arrays to arrange in series.

Figure 8:
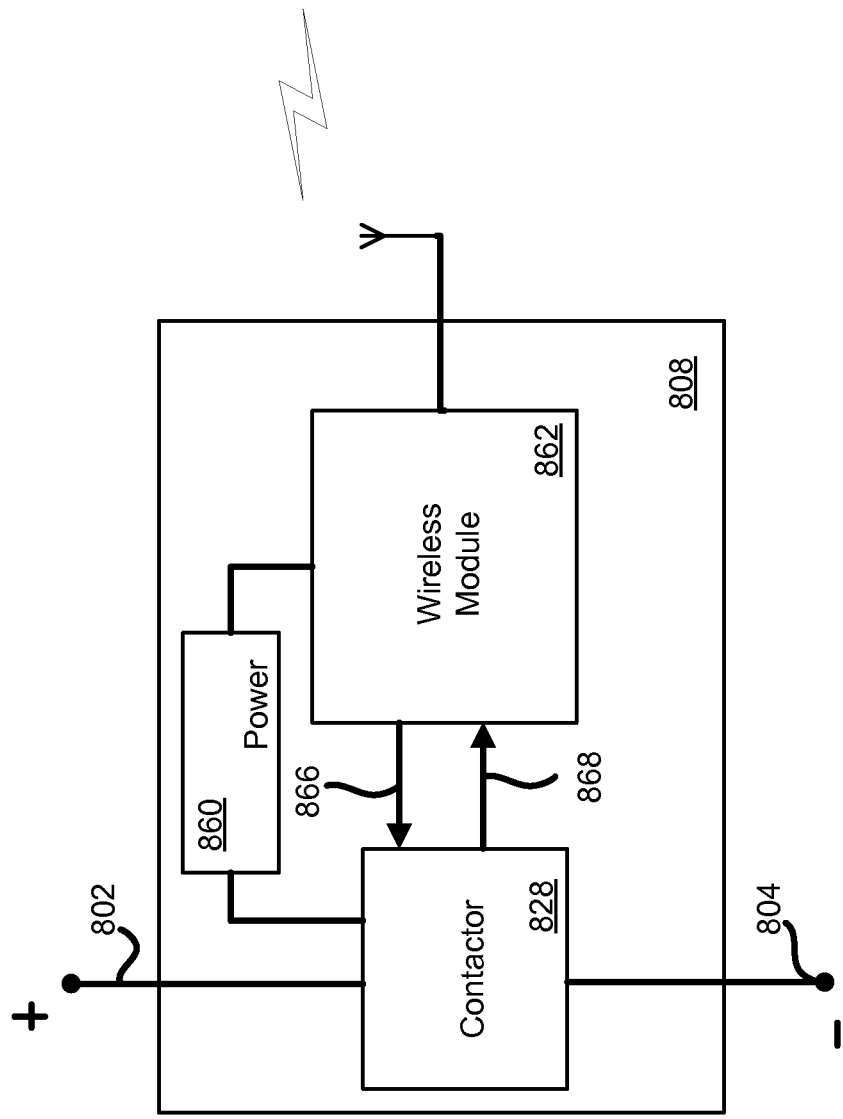
FIG. 8 is a block diagram depicting components of an exemplary embodiment of the distributed-array devices depicted in FIGS. 6A and 6B.

Referring next to FIG. 8, shown is a block diagram depicting components of an exemplary embodiment of the distributed-array devices 608 described with reference to FIG. 6. As shown, in this embodiment, the distributed-array device 808 is wirelessly coupled to a controller (e.g., controller 630). More specifically, the distributed-array device 808 includes a wireless module 862 that is coupled to both a contactor 828 and a power component 860. As depicted, the wireless module 862 is configured to provide control signals 866 that are received from a wireless signal (e.g., sent from the controller 630), and the wireless module 862 is optionally configured to transmit tie information 868 that the wireless module 862 receives from the contactor 828 to the controller.

In general, the power component 860 provides power to the contactor 828 and the wireless module 862. In some embodiments, the power component 860 is configured to receive power from one or more panels of the photovoltaic arrays and convert the power from the array to provide power that may be utilized by the contactor 828 and the wireless module 862. In other embodiments, the power component 860 includes batteries that are used to apply power to the contactor 828 and wireless module 862. And in yet other embodiments, the power component 860 is configured to apply power to the contactor 828 and wireless module 862 that is received from another power source (e.g., utility power source).

The contactor 828 is generally configured to couple and decouple a string of photovoltaic panels in one array with a corresponding string of photovoltaic panels in another array. As described further herein, the contactor 828 may include a relay coil, which is powered by the power component 860, and responsive to the control signal 866, the relay coil opens and closes contacts to couple/decouple the strings from separate arrays. In addition, tie information 868 may include an indication of the status of the contactor 828 (e.g., an indication as to whether the contactor 828 is open or closed), voltage information (e.g., the voltages of the terminals 802, 804 to the contactor 828), current information (e.g., the current flowing through the contactor), and may include fault information (e.g., information about a ground fault or fuse status).

The wireless module 862 generally operates to wirelessly receive control information from the controller 630, which is then provided to the contactor 828, and in some embodiments (but certainly not all) the wireless module 862 transmits the tie information 868 to controller 630. One of ordinary skill in the art will appreciate that the wireless module 862 may be realized by a variety of technologies including RF, power-line carrier, and optical technologies, which may utilize a variety of encryption, encoding, and modulation technologies. In some embodiments, the distributed-array devices 608 and control component 630 may all be addressable and/or networked together in a local area network (e.g., Wi-Fi network) so as to enable a controller (e.g., controller 630) to wirelessly control each distributed-array device separately. Although wireless communication techniques may be utilized to communicate to and from distributed array devices 608, in alternative embodiments, power line communication may also be utilized.

Figure 9:
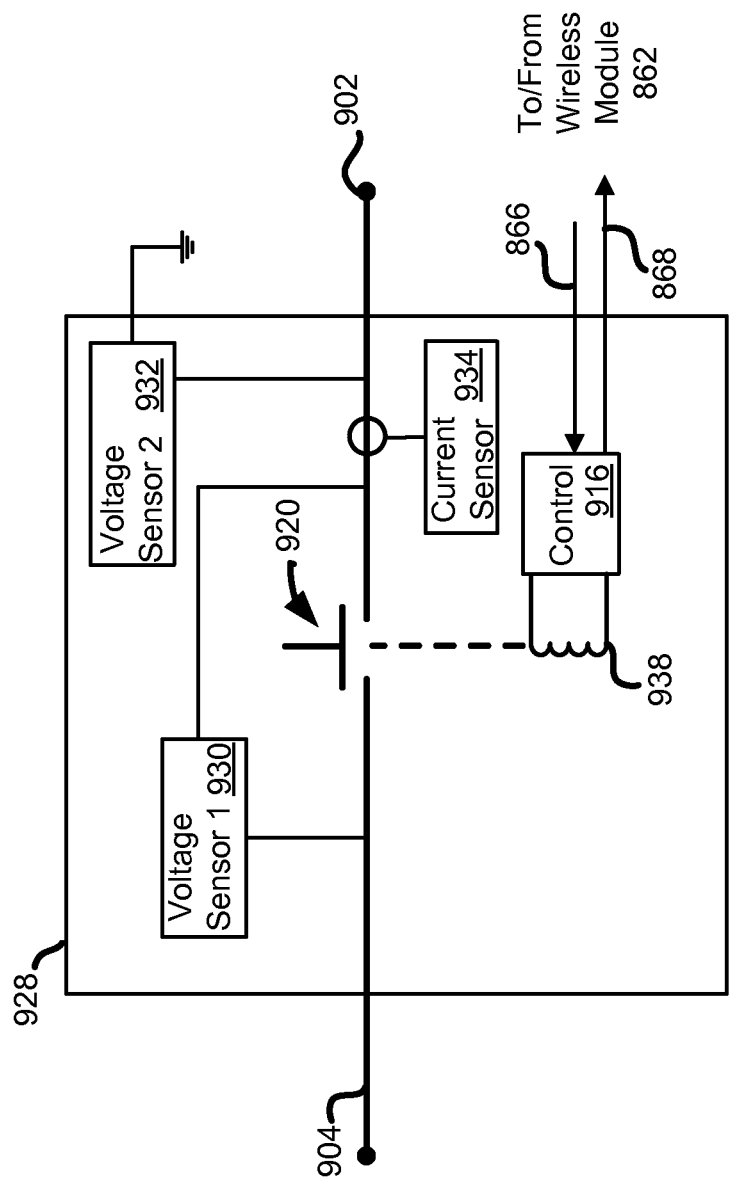
FIG. 9 shows an exemplary embodiment of the contactor depicted in FIG. 8.

Referring to FIG. 9, shown is an exemplary embodiment of the contactor 828 described with reference to FIG. 8. As shown in FIG. 9 the contactor 928 may include a terminal 902 to couple to a negative lead of a string of one array, and another terminal 904 is disposed to couple to a positive lead of a string of another array. For example, terminal 902 may couple to output 670 in FIGS. 6A and 6B, and terminal 904 may couple to output 672. As shown, a switch 920 is coupled between the two terminals 902, 904 so as to switchably couple the two terminals 902, 904. In this embodiment, the switch 920 is part of a relay that also includes a relay coil 938, which is coupled to a control component 916. And responsive to control signals 866 originating from a remote controller (e.g., controller 630) and received via the wireless module 862, the control component 916 applies or removes power from the relay coil 938 to close or open the switch 920.

As shown, in this embodiment the contactor 928 includes a first and second voltage sensors 930, 932 and a current sensor 934. As shown, the first voltage sensor 930 is disposed to sense a potential difference between the terminals 902, 904 of the contactor 928, and the second voltage sensor 932 is disposed to sense the potential of terminal 902 relative to ground; thus the voltage sensors 930, 932 enable the potential of both terminals 902 and 904 (with respect to ground) to be determined. In addition, the contactor 928 includes a current sensor 934 that measures current through the string that is connected through the contactor 928. The control component 916 is configured to receive outputs from the voltage sensors 930, 932 and the current sensor 934, and communicate the voltages and current to a remote controller (e.g., controller 630) via wireless medium, power line carrier, or other wire line communication.

In this embodiment the control component 916, which may be realized by software, firmware, or a combination thereof, controls operation of the switch 920 responsive to the outputs (not shown) of the voltage sensors 930, 932, the current sensor 934, and the control signals 866. For example, when the control component 916 receives a control signal 866 that indicates the switch 920 should be closed, if the potential difference between the terminals 902, 904 is outside of a nominal range, the control component 916 will not close the switch 920. Referring again to FIGS. 6A, 6B, and 7 for example, when the strings are in an idle state, a potential difference is anticipated between the string sections, but if the voltage difference between the terminals 902, 904 exceeds the anticipated difference, the control component 916 will not close the switch 920. As shown in FIG. 7, if the contactor 928 is disposed between the outputs 670 and 672, it is anticipated that the voltage at terminal 902 will be approximately −200 Volts and the voltage at terminal 904 will be at approximately +450 Volts; thus if one or both of the voltages sensed at the terminals 902, 904 vary by a threshold (e.g., a programmable threshold), or a difference between the terminals 902, 904 exceeds a nominal difference, the control component 916 will not close the switch 920.

In the context of strings that are sectioned into two sections (and tied together by one distributed array device 608), the control component 916 may keep the switch 920 open (despite a control signal 866 to close the switch 920) if the voltage offset between each of the terminals 902, 904 relative to ground are different. In other words, the control component 916 will close the switch 920 only when the difference between the voltage at terminal 904 and ground is the same as the difference between the voltage at terminal 902 and ground.

In addition, if the current sensor 934 indicates that a current through the string is exceeding a threshold, the control component 916 may open the switch 920 to prevent a dangerous and/or damaging event.

As discussed with reference to FIG. 7, the voltages of the arrays in idle mode may be set by the inherent resistance of the first and second voltage sensors 930, 932. As depicted in FIG. 9, terminal 902 is coupled to ground via the inherent resistance of the second voltage sensor 932, and terminal 904 is coupled to ground via the inherent resistances of both the first voltage sensor 930 and the second voltage sensor 932. As one of ordinary skill the art will appreciate, these resistances may be increased or reduced if desired by adding additional series or parallel resistance elements.

Figure 10:
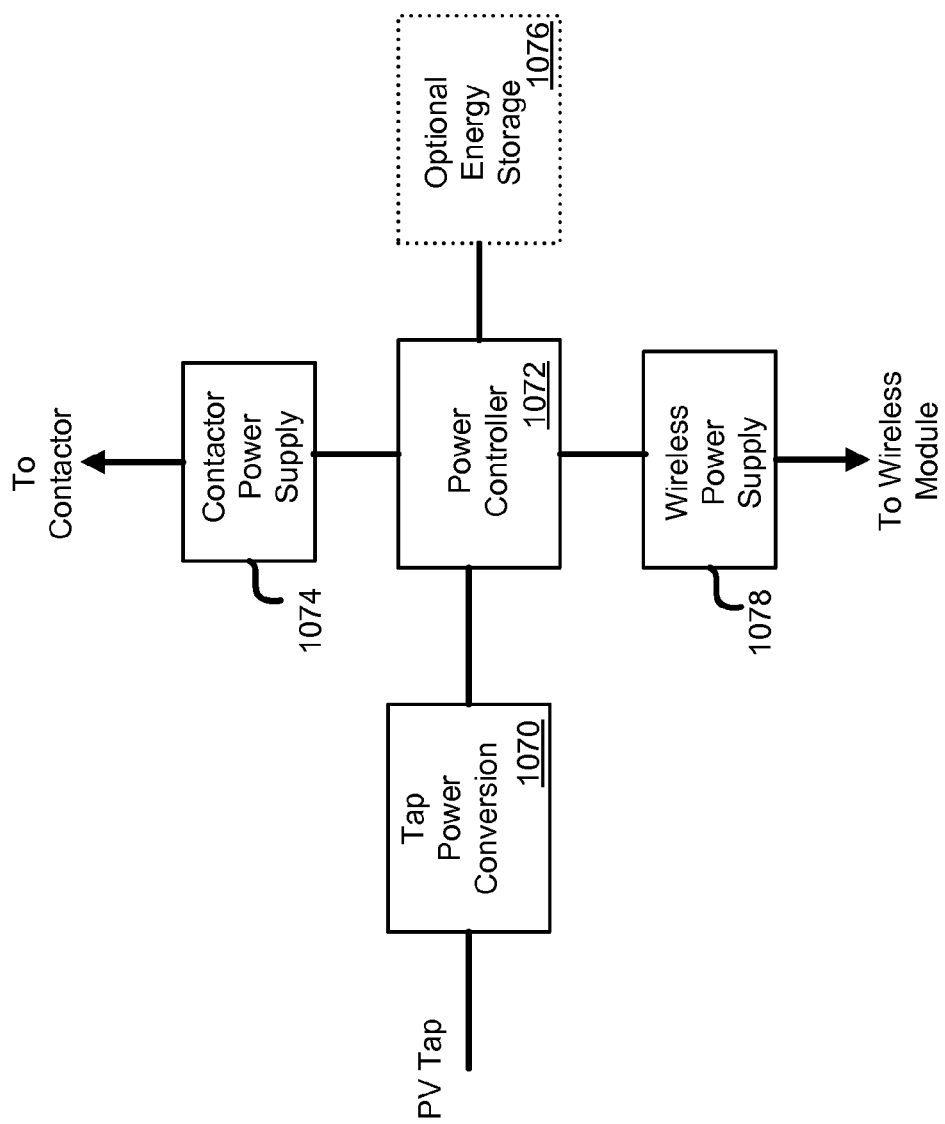
FIG. 10 is a block diagram depicting an exemplary embodiment of the power component depicted in FIG. 8.

Referring to FIG. 10, shown is an exemplary embodiment of the power component 860 described with reference to FIG. 8. As shown, in this embodiment the power component includes a tap power converter 1070 that is coupled between a PV tap (e.g., a portion of a photovoltaic array) and a power controller 1072. In addition, a contactor power supply 1074 is coupled between a contactor (e.g., the contactor 828) and the power controller 1072. The power controller 1072 is also shown coupled to an optional energy storage component 1076 and to a wireless power supply 1078 that is coupled to a wireless module (e.g., the wireless module 862). The illustrated arrangement of the components depicted in FIG. 10 is logical and not meant to be an actual hardware diagram; thus, the functions carried out by the depicted components can be combined or further separated in an actual implementation. For example, the power controller 1072 may be distributed among multiple components depicted in FIG. 8. It should also be recognized that the components, in light of the disclosure herein, may be readily implemented by one of ordinary skill in the art.

In general, the tap power converter 1070 is configured to convert power from a PV tap so that the power may be used by the contactor power supply 1074 and the wireless power supply 1078 to operate the contactor and wireless module, respectively. The tap power converter 1070 may include, for example, a switch mode power supply to down-convert the PV voltage to a lower DC voltage (e.g., 24 VDC). The power controller 1072 operates to manage the application of power from the tap power converter 1070 to the contactor power supply 1074, the wireless power supply 1078, and optionally, the energy storage component 1076 (e.g., rechargeable batteries). In some implementations, the power controller 1072 may include control logic to control the application of power to the contactor power supply 1074 and the wireless power supply 1078. In one embodiment that includes the energy storage component 1076, the power controller 1072 may include charging circuitry to control the charging and discharge of the energy storage component 1076.

Figure 11:
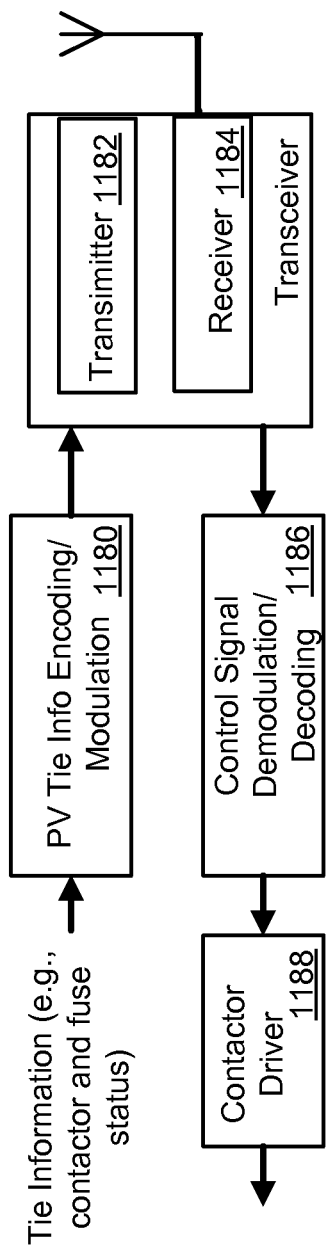
FIG. 11 is a block diagram depicting an exemplary embodiment of the wireless module depicted in FIG. 8.

Referring next to FIG. 11, shown is a block diagram depicting an exemplary embodiment of the wireless module depicted in FIG. 8. The wireless module includes a transmitter chain includes an encoding/modulation component 1180 and a transmitter component 1182, and a receiver chain that includes a receiver portion 1184, a demodulation/decoding component 1186, and a contactor driver 1188. It should be recognized that that the illustrated arrangement of components is logical, and for clarity, does not depict many additional components that are readily available from a variety of commercial sources and familiar to one of ordinary skill in the art.

The encoding/modulation component 1180 is generally configured to receive tie information (e.g., contactor status and fuse status information), encode the tie information (e.g., into a digital format or other form that is amenable to modulation), modulate the encoded tie information and provide the encoded and modulated tie information to the transmitter 1182 for transmission to a controller (e.g., controller 630). In addition, in some embodiments, the encoding/modulation component 1180 encodes identifying information in the tie information that identifies the transmitting distributed-array device so that the controller (e.g., controller 630) will be able to identify the distributed-array device that is sending status information.

The receiver 1184 generally operates to receive control signals from the controller 630, and the demodulator/decoding component 1186 demodulates and decodes the received control signals. As depicted, the demodulated and decoded control signals are provided to the contactor driver component 1188, which applies or withdraws power from a contactor (e.g., contactor 828) responsive to signals to close and open the contactor, respectively.

Figure 12:
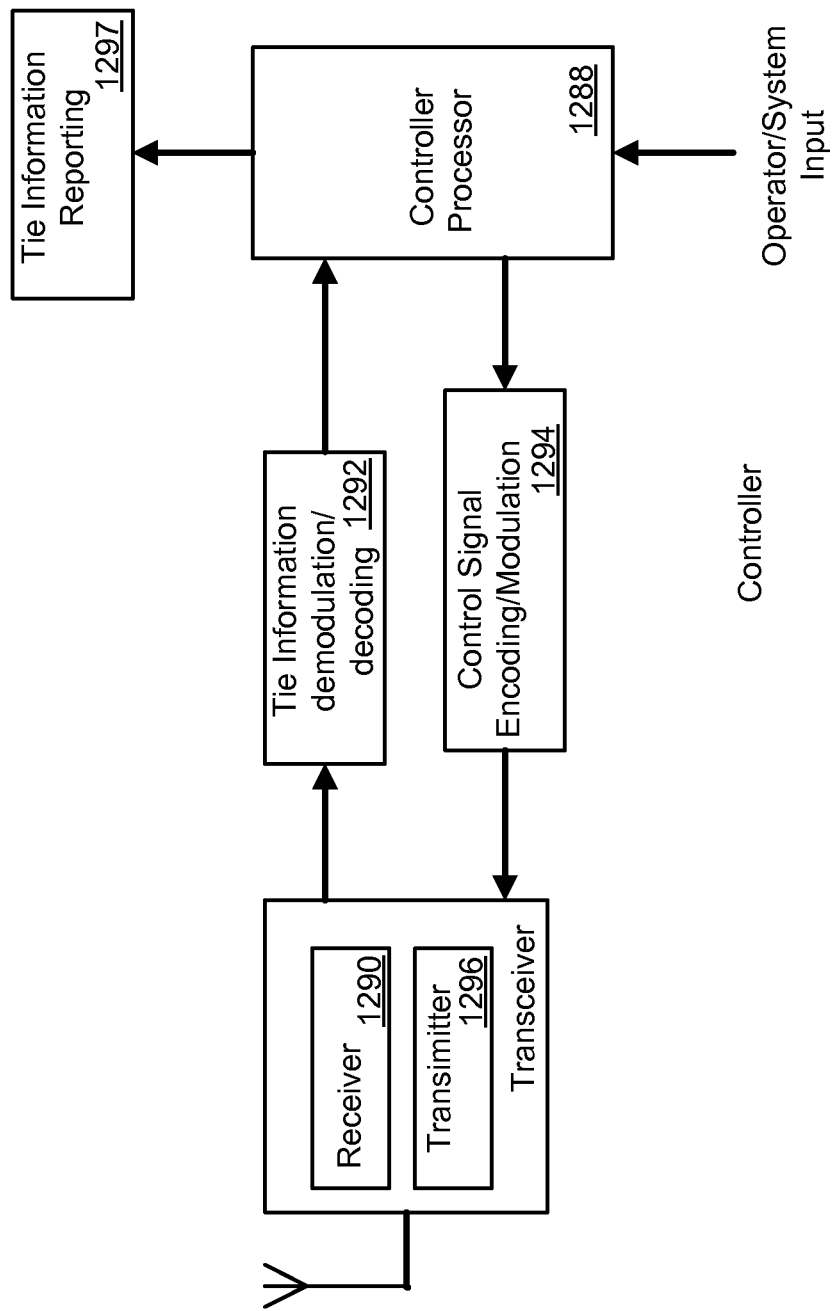
FIG. 12 is a block diagram depicting an exemplary embodiment of the controller 630 in FIGS. 6A and 6B.

Referring next to FIG. 12, it is a block diagram depicting an exemplary embodiment of the controller 630 depicted in FIG. 6. As shown, controller 630 in this embodiment includes a controller processor 1288 that is coupled to a receiver chain that includes a receiver 1290 and a demodulator/decoder component 1292. The control processor 1288 is also coupled to a transmitter chain that includes an encoding/modulation component 1294 and a transmitter 1296. In addition, a reporting component (e.g., a user display or printer) 1297 is coupled to the distributed-array-device controller 1288.

The controller processor 1288 may be realized by hardware, software, firmware or a combination thereof (e.g. a general purpose computer may be adapted with software), and the controller processor 1288 is generally configured to control the operation of distributed array devices (e.g., distributed array devices 608) in one or more strings (e.g., strings$_{1-j}$ described with reference to FIG. 6). As shown, controller processor 1288 includes an operator or system input to enable either manual or system control of distributed-array-devices, and the reporting component 1297 operates to provide feedback (e.g., distributed-array-device status, voltages, currents, and/or fuse status) to an operator. The controller processor 1288 may also be coupled to the power conversion component 630 to receive requests to bring strings online if the power conversion component 630 is intelligent. Alternatively, the controller processor 1288 can analyze the condition of the power conversion component 630, control the power conversion and generate the control signals for the distributed array devices.

As depicted, controller processor 1288 generates control signals that are encoded and modulated by the encoding/modulation component 1294 and transmitted by the transmitter 1296 to the distributed-array devices 608, 808. One of ordinary skill in the art will appreciate that there are many techniques that may be employed to enable distinguishable communications to multiple distributed-array devices 608, 808. In some embodiments, for example, multiple frequencies (e.g., a separate carrier frequency for each distributed-array device), and in other embodiments, communications to each distributed-array device may be specifically encoded (e.g., by the encoding/modulation component 1294) so only the intended distributed-array device may decode (e.g., using the demodulation/decoding component 1186) the control signal. In addition, it is contemplated that security encryption may be utilized to prevent unauthorized control of the distributed-array devices. The receiver 1290 in this embodiment receives tie information (e.g., contactor and fuse status information) from each of the distributed-array devices, and the demodulation/decoding component 1292 demodulates and decodes the received information so that both information identifying the distributed-array device 608, 808 and the tie information may be processed by the controller processor 1288 and reported.

Figure 13:
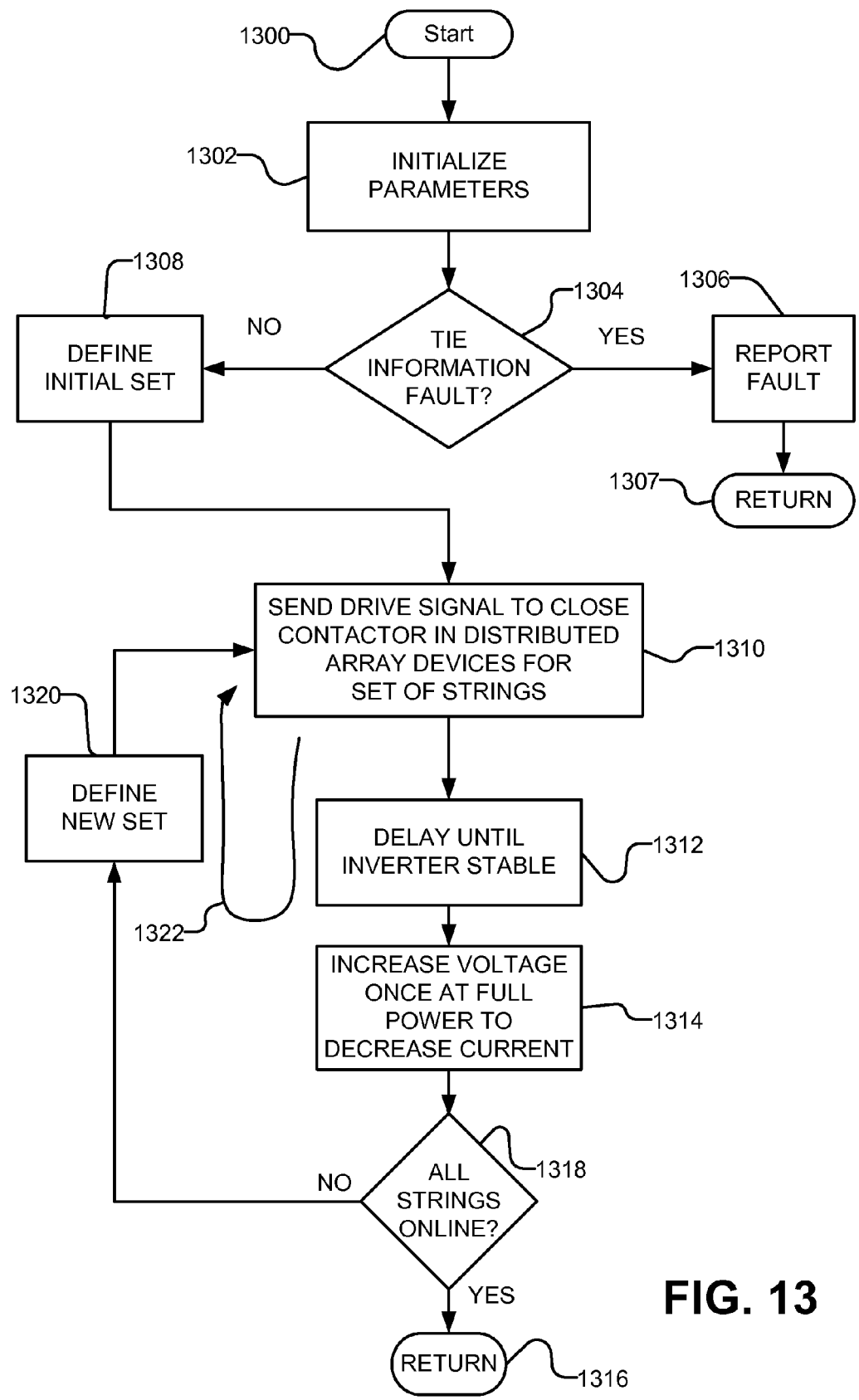
FIG. 13 is a flow chart for an exemplary operational flow for a process according to several embodiments of the present invention.

FIG. 13 is a flow chart for an exemplary embodiment of an operational flow for a process that may be carried out in connection with the embodiments disclosed herein. For example, the method depicted in FIG. 13 may be executed by the controller processor 1288 described with reference to FIG. 12. As shown, the process performs the startup operations to bring photovoltaic strings (e.g., the strings $S_{1-j}$ described with reference to FIG. 6) online to the power converter (e.g., power conversion component 610). A startup request may be generated any number of ways. For example, operator input to the controller processor 1288 could signal a startup request, or an automated system could generate a startup request based on a clock signal as for example indicating an appropriate time of day to bring the strings online. Alternatively, an automated system might monitor floating voltages at the strings or at the power converter for an indication of photovoltaic activity in the strings. One skilled in the art will appreciate that any number of conditions and techniques might be used to request the startup process to bring the strings online with the power converter.

As shown, once the startup process is initiated, parameters are initialized 1302. For example, string parameters M and K that specify the initial set of strings to be connected to a power converter (e.g., the power converter 630) by contactors (e.g, contactors 928) in distributed array devices (e.g., distributed array devices 608, 808). Parameter N specifies the initial string $S_N$ and typically would be the first string $S_1$. However, there may be reasons to start the process at another string as for example if string $S_1$ has a fault and is taken offline for repair. Parameter K is added to N to specify the last string of the set. Thus K is the separation between the first string and last string in the set. For example, if initially K is four (4) and M is one (1) then M+K is five (5), and the last string in the set is $S_5$. Parameter K is chosen based on the number of strings that can be simultaneously added without exceeding the voltage and current rating for the power converter. Parameter K can be zero (0) if an operator, or the automated system, is bringing the strings online one at a time. Parameter K can be the integer number Z−1 where Z is the total number of strings in the photovoltaic system. Of course K=Z−1 can only be used if the solar energy situation dictates that the power converter can handle all the strings at one time.

Fault decision operation 1304 tests whether tie information from any string indicates a ground fault. For example voltages of one or more terminals of a distributed array device 608 may indicate a fault condition exists. If there is a ground fault, the tie information also carries identification information indicating which contactor 928 and thus its distributed array device that has sensed the fault. If fault information has been detected by fault test operation 1304, the operation flow branches YES to report fault operation 1306. Report fault operation displays a fault report or prints a fault report at tie information report device 1297. Operation flow than returns to the main program flow to await the next startup request. The operator (or an automated system) observing the fault report will resolve the fault condition and then issue another startup request when appropriate.

If there is no system fault, then an initial set of strings is defined 1308. For example, the parameter N is used to specify the first string $S_N$ in the initial set of strings to be connected online to the power converter and uses parameters N and K to specify the last string $S_{N+K}$ in the initial set of strings being brought online.

Send drive operation 1310 identifies first string $S_N$ and last string $S_{N+K}$ and sends drive signals to all contactors in strings of the initial string set. As described above in reference to FIG. 9, the drive signals close switch 920 in contactors 928 that receive drive signals. Closing these contactors for distributed array devices of strings $S_N$ to $S_{N+K}$ brings strings $S_N$ to $S_{N+K}$ online with the power conversion component 630.

As depicted in FIG. 13, after a string or strings are brought online, there is a brief delay 1312 before the next string or collection of strings is brought online so that the power conversion component (e.g., inverter) arrives at a stable state before bringing additional strings online. And if the power conversion component reaches full power, then the voltage on the rails 640, 650 is increased so as to decrease the current 1314.

All-strings-online test operation 1318 detects whether all available strings in the arrays from $S_1$ to $S_J$ have been connected online to the power converter. If all strings are online, the operational flow branches from test operation 1318 to return connector 1316. Again the startup process terminates and operational flow returns to the main operational flow of controller processor 1288. On the other hand, if strings are available to be connected online, the operational flow branches NO from test operation 1318 to advance parameters operation 1320.

New set defining operation 1320 resets the initial parameters M and K parameters to new parameters M' and K' for the new set of strings to be brought online. Typically M' would equal M+K+1 (M'=M+K+1), and K' would remain unchanged and would be equal to K (K'=K). Therefore, the first string of the new set would then be $S_{N'}$ and the last string of the new set would be $S_{N'+K}$. This pattern of defining new sets would continue with the first string of a new set being the last string of the previous set advanced by one string and the size of the sets of strings remaining K+1.

Alternatively, the power converters interaction with the previous set of strings coming online may indicate that the new set of strings needs to be reduced in size or may be increased in size relative to the previous set. In such an event K' will not equal K, and K' is respectively decreased or increased relative to K. If K' is different from K, then the last string in the new set will be $S_{N'+K'}$. One skilled in the art will appreciate that many other expressions to define M' and K' may be chosen to change the starting string and size of each set of strings being brought online.

In another exemplary embodiment new input parameters M' and K' might be provided to the new set defining operation 1320. Parameter M' might specify a starting string for the new set that is not numerically in sequence the previous set of strings. This would allow the pattern of sets of strings coming online to the power converter. Also, parameter K' might be a random number from 0 to Y−1 where Y is the total number of strings from $S_{M'}$ to the last available string in sequence from $S_{M'}$. These variations in M' and K' would allow the strings to brought online in whatever physical pattern and time sequential pattern is most advantageous in starting up the arrays and power converter.

After advance parameters operation 1320 defines the first and last strings in the next set coming online, the operation flow passes to send drive signal operation 1310. Send drive signal operation sends the drive signals to all the contactors in the distributed array devices of the set of strings being brought online. Operational loop 1322 continues as more sets of strings are defined and brought online until the power converter reaches full capacity as detected by test operation 1314, or all strings are online as detected by test operation 1318.

In conclusion, the present invention provides, among other things, a system and method for interfacing with multiple photovoltaic arrays. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A photovoltaic system comprising:
a first photovoltaic string and a second photovoltaic string, each of the photovoltaic strings is electrically coupled in parallel to each other between a positive rail and a negative rail and each of the photovoltaic strings includes a plurality of photovoltaic panels;
a first set of N distributed-array devices within the first photovoltaic string, the first set of N distributed-array devices arranged in series with the photovoltaic panels of the first string, and the first set of N distributed array devices, on demand, electrically decouples the first photovoltaic string into N+1 portions so as to break a current path between the positive and negative rails through the first photovoltaic string, wherein N is two or more;
a second set of N distributed-array devices within the second photovoltaic string, the second set of N distributed-array devices arranged in series with the photovoltaic panels of the second string, and the second set of N distributed-array devices, on demand, electrically decouples the second photovoltaic string into N+1 portions so as to break a current path between the positive and negative rails through the second photovoltaic string; and
at least one controller that controls the first and second sets of N distributed-array devices to electrically decouple the N+1 portions of each photovoltaic string during an idle period and to electrically couple the N+1 portions of each photovoltaic string during a start-up period, so that during the idle period the photovoltaic strings do not apply power between the positive and negative rails, and during a start-up period, the first set of distributed-array devices electrically couples the N+1 portions of the first photovoltaic string together before the second set of N distributed array devices couples the N+1 portions of the second photovoltaic string together so that the first photovoltaic string applies power to the positive and negative rails before the second photovoltaic string.

2. The photovoltaic system of claim 1, including a plurality of photovoltaic strings wherein:
each of the photovoltaic strings including a corresponding set of N distributed-array devices, which on demand, separates each of the photovoltaic string into N+1 portions; and
the controller controls each of the sets of N distributed-array devices to electrically couple sequentially each set of N distributed array devices during the start-up period, so that each of the photovoltaic strings applies power to the positive and negative rails sequentially in time.

3. The photovoltaic system of claim 2 further comprising:
a power conversion component electrically coupled between the positive rail and the negative rail converting the voltage and current from the each photovoltaic string and the second photovoltaic string to output voltage and current from the power conversion component; and
the power conversion component converting voltage and current from each of the first and section strings as the strings are sequentially, electrically coupled to the positive and negative rail so that power applied to the power conversion component increases without exceeding the power rating of the power conversion component as strings are coupled to the rails.

4. The photovoltaic system of claim 3 further comprising:
N+1 photovoltaic arrays, each array including one portion of each photovoltaic string;
each distributed-array device coupling one portion of each photovoltaic string on one array in series with a portion of the same string on another array whereby the photovoltaic strings are electrically coupled or decoupled in parallel from array to array by each string's corresponding set of distributed-array devices.

5. The photovoltaic system of claim 4 wherein the controller monitors the voltage and current at the power conversion component as strings are coupled to the rails and controls the sequentially coupling of the next string to the rails so that voltage and current at the power conversion component does not exceed the power rating for the power conversion component.

6. A photovoltaic system having a plurality of photovoltaic panels distributed over a plurality of arrays to provide a source of electrical power, said system comprising:
a plurality of photovoltaic strings, each photovoltaic string having a plurality of photovoltaic panels in electrical series and each string extending across the plurality of arrays;
each array having a portion of a string connected to another portion of the same string on another array by a tie connector;
a switch in each tie connector to electrically couple and decouple the portions of the string;
the portions of photovoltaic strings tie connected in parallel from array to array by the switches for each string and all strings connected to power rails collecting the power from all the strings;
a power converter, electrically connected to the power rails, converting the power from each string as all portions of each string are electrically coupled by the switches for the string and the power from each string comes online to the power rails and thereby to the power converter; and
a controller controlling the switches during system startup to electrically couple strings to the power rails in time sequence so that the power increases at the power converter without the power exceeding the power rating of the power converter as the strings come online.

7. The photovoltaic system of claim 6 wherein:
the controller controls the switches during an idle mode to decouple all portions of all strings so that voltage on each portion of each string rises to a open circuit voltage for the portion.

8. The photovoltaic system of claim 7 wherein there are N switches per string and during idle mode each string is divided into N+1 portions.

9. The photovoltaic system of claim 8 wherein
the controller controlling the switches for sets of strings during system startup to electrically couple sets of strings to the power rails in a time sequence, for each set of strings the controller simultaneously couples switches for K+1 strings as a set of strings from string $S_M$ to string $S_{M+K}$, where
M is the number of the first string in the set
M+K is the number of the last string in the set and
K is an integer number starting with zero (0),
so that each string in a set comes online to the power converter simultaneously with all other strings in the set.

10. The photovoltaic system of claim 9 wherein the controller is responsive to power capacity information from the power converter to advance parameters M and K to specify the next set of strings to come online to the power converter so that the first string in the next set and the size of the next set maybe controlled.

11. The photovoltaic system of claim 6 wherein the tie connector includes
at least one voltage sensor to sense a voltage at a terminal of the tie connector.

12. The photovoltaic system of claim 11 wherein the tie connector communicates a value of the voltage to the controller.

13. A photovoltaic system comprising:
a plurality of parallel-arranged photovoltaic strings, each of the plurality of photovoltaic strings coupled between a positive rail and a negative rail and each of the plurality of strings including a plurality of photovoltaic panels;
at least one distributed-array device within each of the photovoltaic strings, each of the distributed-array devices arranged in series with the photovoltaic panels of the corresponding photovoltaic string, each of the distributed array devices, on demand, switchably couples or decouples portions of each corresponding string so as to create or break a current path between the positive and negative rails through each corresponding string; and
at least one controller that controls the distributed-array devices so that, during a start-up period, some of the distributed-array devices create current paths through some of the photovoltaic strings between the positive and negative rails before other distributed array devices create current paths through others of the photovoltaic strings between the positive and negative rails.

14. The photovoltaic system of claim 1, wherein the controller controls the distributed-array devices so that, during the start-up period, initially one string applies power to the positive and negative rails, then two strings apply power to the positive and negative rails until each of the plurality of strings applies power to the positive and negative rails.

15. A method for operating a photovoltaic system, the method comprising:
operating each of a plurality of photovoltaic strings in parallel between conducting rails that are coupled to a power conversion component so that current paths are formed between the conducting rails, each of the photovoltaic strings including series-arranged photovoltaic panels, and within photovoltaic string, each of the series-arranged photovoltaic panels operates at a different voltage than other ones of the photovoltaic panels;
separating each of the plurality of photovoltaic strings into a plurality of string sections so that, during an idle state, current does not flow between the rails through the photovoltaic strings; and creating, during the idle state, a voltage overlap between the separated string sections in each of the photovoltaic strings so that, within each photovoltaic string, some voltages along one of the string sections are the same as some voltages along another one of the string sections.

16. The method of claim 15, wherein separating includes separating each of the plurality of photovoltaic strings into only two string sections so that, during an idle state, current does not flow between the rails through the photovoltaic strings;
wherein creating, during the idle state, includes creating a voltage overlap between the two separated string sections in each of the photovoltaic strings so that, within each photovoltaic string, some voltages along one of the string sections are the same as some voltages along the other string section.

17. The method of claim 15, wherein separating includes separating each of the plurality of photovoltaic strings into three string sections so that, during an idle state, current does not flow between the rails through the photovoltaic strings;
wherein creating, during the idle state, includes creating a voltage overlap between the three separated string sections in each of the photovoltaic strings so that, within each photovoltaic string, some voltages along each of the string sections are the same as some voltages along the other two string sections.

18. The method of claim 15, including:
coupling together the strings sections in a subset of the photovoltaic strings to bring the subset of the photovoltaic strings online with the power conversion component, wherein coupling the subset reduces and extent of the voltage overlap;
successively coupling together the string sections in other subsets of the photovoltaic strings, wherein the extent of the voltage overlap is reduced after each successive coupling until all the photovoltaic strings are brought online, and when all the photovoltaic strings are online, the voltage overlap does not exist.

19. A photovoltaic string coupling device including:
a first terminal to couple to a first string section of a photovoltaic string;
a second terminal to couple to a second string section of a photovoltaic string;
a switch disposed between the first and second terminals so as to enable the first and second string sections of the photovoltaic string to be conductively coupled when the switch is closed; and
means for creating a voltage overlap between the first and second string sections when the switch is opened so that some voltages along the first string section are the same as some voltages along the second string section.

* * * * *